United States Patent [19]
Kawamura

[11] Patent Number: 5,963,490
[45] Date of Patent: Oct. 5, 1999

[54] STATIC SEMICONDUCTOR MEMORY DEVICE HAVING A VARIABLE POWER SUPPLY VOLTAGE APPLIED TO A MEMORY CELL DEPENDING ON THE STATE IN USE AND METHOD OF TESTING THE SAME

[75] Inventor: Hideki Kawamura, Hyogo, Japan

[73] Assignee: Mitsubishi Denki Kabushiki Kaisha, Tokyo, Japan

[21] Appl. No.: 08/881,281

[22] Filed: Jun. 24, 1997

[30] Foreign Application Priority Data

Nov. 14, 1996 [JP] Japan .................................. 8-303095

[51] Int. Cl.⁶ .................................................. G11C 29/00
[52] U.S. Cl. .................... 365/201; 365/228; 365/189.03; 365/189.09
[58] Field of Search .................................. 365/201, 228, 365/154, 156, 189.03, 189.09

[56] References Cited

U.S. PATENT DOCUMENTS 5,132,929 7/1992 Ochii ........................................ 365/201
5,463,585 10/1995 Sanada ..................................... 365/201

FOREIGN PATENT DOCUMENTS

| 40 22 157 C2 | 1/1991 | Germany | G11C 29/00 |
| 61-264274 | 11/1986 | Japan | G01R 31/28 |
| 1-166391 | 6/1989 | Japan | G11C 11/34 |
| 6-176588 | 6/1994 | Japan | G11C 16/06 |

*Primary Examiner*—Andrew Q. Tran
*Attorney, Agent, or Firm*—McDermott, Will & Emery

[57] ABSTRACT

In carrying out testing, the potential of the node N1 of the state change detect circuit attains high level. This allows the power supply voltage supply line to receive a voltage down-converted by the voltage-down converter from the power supply voltage supplied from the power supply. In the normal use, the potential of the node of the state change detecting circuit attains a low level and the power supply voltage supply line receives the power supply voltage from the power supply. Since the power supply voltage supply line is connected to load elements for a memory cell and a voltage applied to the load elements for the memory cell is smaller than that in the normal use, the difference in potential between two storage nodes of the memory cell can be reduced as compared with that in the normal use. Thus, a condition comparable to that of an SRAM placed in the low-temperature environment can be created.

12 Claims, 21 Drawing Sheets

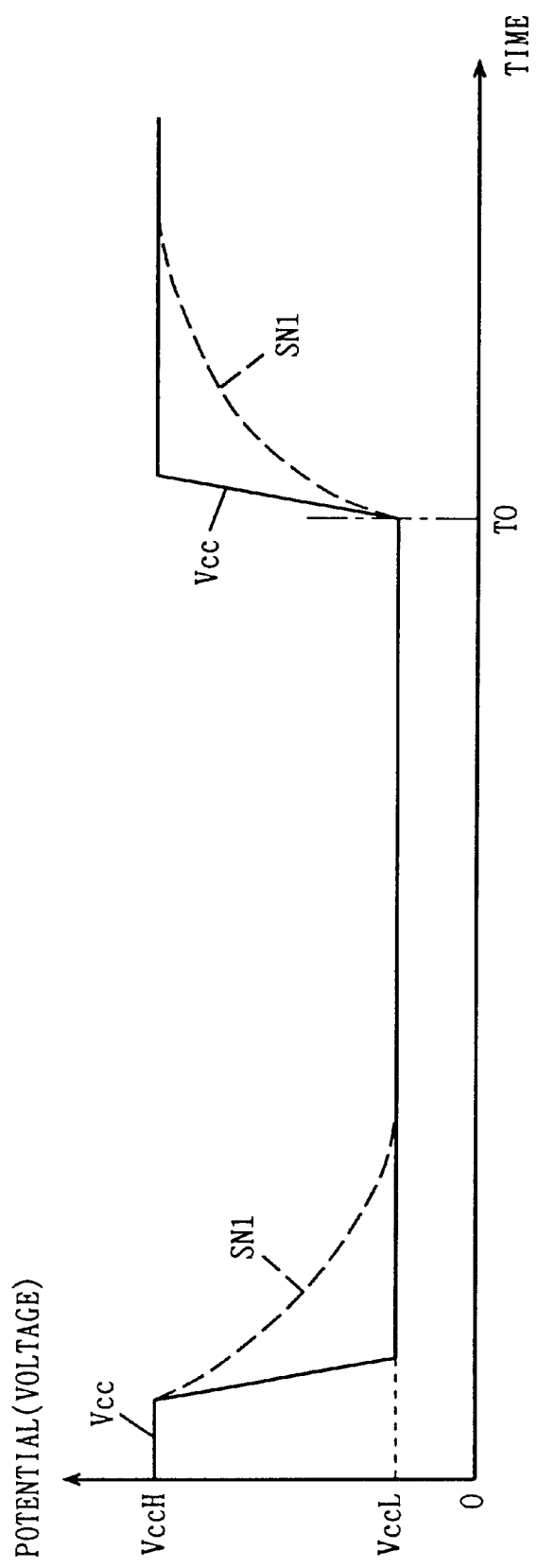
F I G. 3 3  PRIOR ART

STATIC SEMICONDUCTOR MEMORY DEVICE HAVING A VARIABLE POWER SUPPLY VOLTAGE APPLIED TO A MEMORY CELL DEPENDING ON THE STATE IN USE AND METHOD OF TESTING THE SAME

BACKGROUND OF THE INVENTION

1. Field of the Invention

The present invention relates to a static semiconductor memory device and a method of testing the same and in particular to a static semiconductor memory device capable of creating a condition comparable to the low temperature test environment at the normal temperature or at high temperature and a method of testing the same.

2. Description of the Background Art

FIG. 31 is a circuit diagram showing the detail of a memory cell of a static random access memory (referred to as an SRAM hereinafter) as a conventional static semiconductor memory device.

Referring to FIG. 31, the conventional SRAM memory cell includes driver transistors 57 and 59, access transistors 53 and 55, and high resistance elements 61 and 63. A bit line BL is connected to an NMOS transistor 43 as a bit line load, and a bit line /BL is connected to an NMOS transistor 45 as a bit line load.

A read operation thereof will now be described. When it is assumed that a storage node SN1 is at a high level and the potential of a storage node SN2 is at a low level, and driver transistor 57 is turned off and drive transistor 59 is turned on. Assuming that the potential of a word line WL is at low level and is not in a selected state, access transistors 53 and 55 are both turned off. When the potential of word line WL attains high level and its state is changed to a selected state, access transistors 53 and 55 are both turned on.

Then, a direct current, that is, a column current flows through a route of a power supply 41→NMOS transistor 45→bit line/BL→access transistor 55→driver transistor 59→a ground 65. The instantly flowing column current increases the potential level of ground 65 serving as the source of driver transistor 59, and as a result, the potential of storage node SN2 at the low level is slightly increased. The potential of storage node SN2 exactly at the instant when word line WL rises is represented by v0+v1, wherein v1 represents the increased potential and v0 represents the drain potential of driver transistor 59 by on-resistance of driver transistor 59. The potential settles down at v0 when a certain time period elapses.

Furthermore, since the potential of storage node SN2, serving as the gate potential of driver transistor 57, is slightly increased, the state of driver transistor 57 is changed from the non-conductive state to a slightly conductive state. This causes the potential of storage node SN1 to drop from the high level. The potential of storage node SN1 exactly at the instant when word line WL rises is represented by a power supply voltage Vcc−v2, wherein v2 represents the amount of the potential drop.

Data-hold characteristics are determined by the relation in magnitude between the potential of storage node SN1 exactly at the instant when word line WL rises, i.e., Vhold−v2, and the potential of storage node SN2, i.e., v0+v1, wherein Vhold represents a power supply voltage in data-hold. More specifically, when the potential of storage node SN1 represented by Vhold−v2 is larger than that of storage node SN2 represented by v0+v1, data is normally held. When the potential of storage node SN1 represented by Vhold−v2 is smaller than that of storage node SN2 represented by v0+v1, held data is inverted.

Thus, one of the severest conditions for data-hold of memory cells is the moment at which the difference between the potential of storage node SN1 and the potential of storage node SN2 is decreased, that is, the moment at which word line WL rises (which is a first factor causing a memory cell to be unstable). Furthermore, in order to reduce current consumption for data-hold, power supply voltage Vhold in data-hold may be reduced. This further decreases the difference between the potential of storage node SN1 and the potential of storage node SN2 and thus data inversion can be readily caused (which is a second factor causing a memory cell to be unstable). Furthermore, data inversion can be more readily caused if slight leakage current due to a slight defect or the like is caused at storage node SN1 the potential of which is held at high level (which is a third factor causing a memory cell to be unstable). Furthermore, a memory cell is rendered further unstable at low temperature (which is a fourth factor causing a memory cell to be unstable).

A cause of unstabilization of a memory cell at low temperature will now be described in detail. Change in a power supply voltage supplied from power supply 41 does not match with change in the potential of storage node SN1 supplied with the power supply voltage from power supply 41 via high resistance element 61 (i.e., the storage node which is set at a high level potential). More specifically, the potential of storage node SN1 transits with a time constant RC represented by a product of a resistance value R of high resistance element 61 and a capacitance value C of storage node SN1.

FIG. 32 illustrates a change in the potential of storage node SN1 set at high level at the normal temperature. Referring to FIG. 32, when power supply voltage Vcc is changed from a VccH level to a VccL level, the potential of storage node SN1 is also changed following the change of the power supply voltage. This also applies when the power supply voltage is changed from the VccL level to the VccH level. That is, at the normal temperature, changes in the power supply voltage supplied from power supply 41 almost matches with changes in the potential of storage node SN1 set at high level. It should be noted that high resistance elements 61 and 63 are generally formed of polysilicon. Polysilicon has temperature characteristics in conductivity and the resistance value is increased at lower temperature. Thus, the lower temperature is, the longer time (RC) a transition of the potential of storage node SN1 set at high level takes than a change of the power supply voltage supplied from power supply 41 does.

FIG. 33 illustrates change of the potential of storage node SN1 set at high level at low temperature. Referring to FIG. 33, when the power supply voltage supplied from power supply 41 is changed from the VccH level to the VccL level, the potential of storage node SN1 changes more slowly than the change of power supply voltage Vcc. This also applies when power supply voltage Vcc is changed from the VccL level to the VccH level. That is, at low temperature, a transition of the potential of storage node SN1 set at high level takes a longer time (RC) than a change of power supply voltage Vcc. Thus, if word line WL attains a high level and a memory cell is selected during a transition of the potential of storage node SN1 from the VccL level to VccH level, that is, before the potential of storage node SN1 reaches the VccL level, column current flows into the memory cell and the memory cell falls into the most unstable condition.

Memory cells are typically designed with sufficient margin so that they satisfactorily hold data even in such an unstable condition. In fact, however, unsatisfactory data hold is caused by the factors described above and thus it is required to remove an SRAM having such a defective memory cell. The unsatisfactory data hold caused by the four factors described above is herein referred to as "low temperature hold defect". In order to remove an SRAM including a memory cell having the low temperature hold defect, a test environment at low temperature is created to carry out testing in the environment.

Referring to FIG. 33, a test carried out in such a lower temperature environment will now be described. At low temperature, power supply voltage Vcc is changed from the VccL level to the VccH level at time point T0. Then a memory cell is selected and column current flows into it. Furthermore, after the potential of the storage node reaches a readable level, data is read from the memory cell. The read data is compared with written data at the normal temperature prior to placing the SRAM in the low temperature environment to determine whether a low temperature hold defect has been caused.

Thus, for conventional SRAMs, it is necessary to create a low temperature test environment for testing for low temperature hold defect and to carry out the testing in that environment. This requires enormous cost for creating the low temperature test environment.

SUMMARY OF THE INVENTION

One object of the present invention is to provide a static semiconductor memory device capable of creating a condition comparable to the low-temperature test environment at the normal temperature or a temperature higher than the normal temperature without creating a low-temperature testing environment.

Another object of the present invention is to provide a static semiconductor memory device capable of detecting low-temperature hold defect at the normal temperature or higher temperature than the normal temperature.

A static semiconductor memory device according to a first aspect of the present invention includes a plurality of memory cells, a state change detect circuit, and a power supply voltage select circuit. Each memory cell has first and second storage nodes to be set at potentials of different levels from each other. The state change detect circuit detects changes in state of the memory device. The power supply voltage select circuit applies a first power supply voltage to the plurality of memory cells when the state change detect circuit does not detect any change in the state. The power supply voltage select circuit applies a second power supply voltage differing from the first power supply voltage to the plurality of memory cells when the state change detect circuit detects a change of the state. The first and second power supply voltages are applied for setting a potential of the first or second storage node of a memory cell at a level according to stored information.

Since a power supply voltage applied to a memory cell in a static semiconductor memory device according to the first aspect of the present invention is changed according to the state change detect circuit, a power supply voltage smaller than that for the normal use can be applied to a memory cell in carrying out testing. Thus, the difference in potential between the first storage node and the second storage node of a memory cell can be decreased as compared with that in the normal use. This allows a condition comparable to that of a static semiconductor memory device placed in the low-temperature environment and thus cost required for creating a test environment can be reduced. Furthermore, low-temperature hold defect can be detected at the normal temperature or a temperature higher than the normal temperature.

A method of testing a static semiconductor memory device according to a second aspect of the present invention is a method of testing a static semiconductor memory device having first and second storage nodes to be set at potentials of a different levels from each other. The method of testing a static semiconductor memory device includes the steps of: rendering the difference in potential between the first storage node and the second storage node smaller than the difference in potential between the first storage node and the second storage in the normal use; and flowing current into the first and second storage nodes.

Since a method of testing a static semiconductor memory device according to the second aspect of the present invention renders the difference in potential between a first storage node and a second storage node of a memory cell smaller than that in the normal use, a condition can be created comparable to that of a static semiconductor memory device placed in the low-temperature environment. Furthermore, low-temperature hold effect can be detected at the normal temperature or a temperature higher than the normal temperature.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 33 illustrates the change of the potential of a storage node (SN1) of a conventional SRAM at lower temperature.

DESCRIPTION OF THE PREFERRED EMBODIMENT

Figure 1:
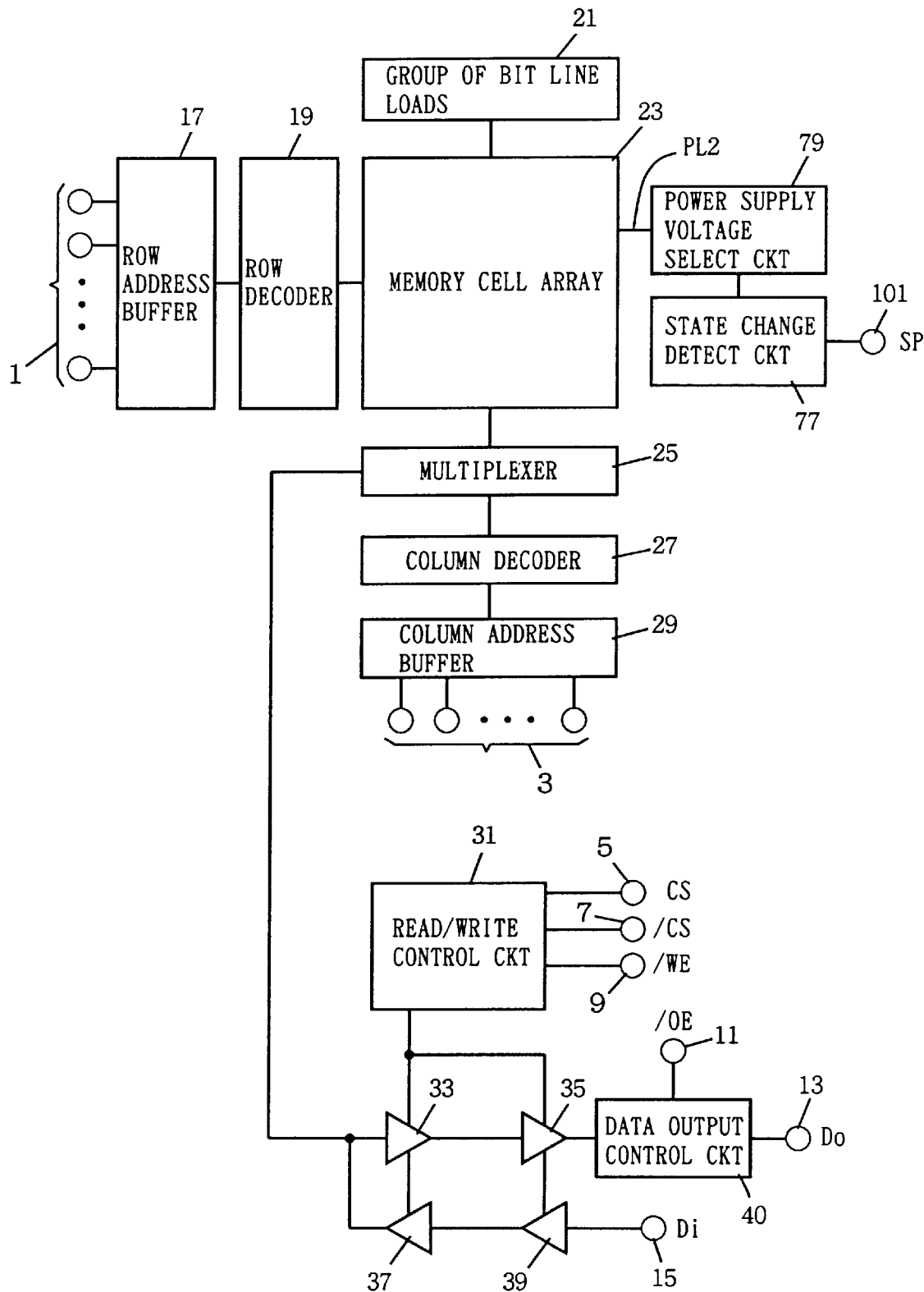
FIG. 1 is a schematic block diagram showing the entire configuration of an SRAM according to an embodiment of the present invention.

FIG. 1 is a schematic block diagram showing the entire configuration of an SRAM as a static semiconductor memory device according to an embodiment of the present invention. Referring to FIG. 1, the SRAM includes groups of address input terminals 1 and 3, a CS input terminal 5, a /CS input terminal 7, a /WE input terminal 9, a /OE input terminal 11, a data output terminal 13, a data input terminal 15, an SP input terminal 101, a row address buffer 17, a row decoder 19, a group of bit line loads 21, a memory cell array 23, a multiplexer 25, a column decoder 27, a column address buffer 29, a read/write control circuit 31, a sense amplifier 33, an output data buffer 35, a write buffer 37, a power supply voltage select circuit 79, a state change detect circuit 77, an input data buffer 39, and a data output control circuit 40. CS input terminal 5, /CS input terminal 7, /OE input terminal 11 and data output control circuit 44 are not necessarily provided.

The group of address input terminals 1 receives a row address signal. Row address buffer 17 amplifies or inverts a row address signal. Row decoder 19 decodes a row address signal input to the group of address input terminals 1. The group of address input terminals 3 receives a column address signal. Column address buffer 29 amplifies or inverts a column address signal. Column decoder 27 decodes a column address signal input to the group of address input terminals 3. Memory cell array 23 has memory cells (not shown) for storing information arranged in a matrix.

Sense amplifier 33 senses and amplifies a read voltage having a small amplitude. Output data buffer 35 amplifies an output of sense amplifier 33 to the level to be externally output. Data output control circuit 40 allows an output of output data buffer 35 to be supplied to data output terminal 13 when an output enable signal (output control signal) /OE input from /OE input terminal 11 attains low level. Data output terminal 13 outputs an output from output data buffer 35, that is, output data Do. Data input terminal 15 receives write data Di. Input data buffer 39 amplifies a signal (write data Di) input to data input terminal 15. Write data buffer 37 converts the data Di amplified by input data buffer 39 into data to be written into a memory cell.

CS input terminal 5 receives a chip select signal CS. When chip select signal CS attains high level, a chip (SRAM) is put into a selected state. /CS input terminal 7 receives a chip select signal /CS. When chip select signal /CS is at low level, the chip (SRAM) is put into a selected state. /WE input terminal 9 receives a write enable signal (a read/write control signal) /WE. When write enable signal /WE is at low level, data can be written into a memory cell. When writing enable signal /WE attains high level, data can be read from a memory cell. Read/write control circuit 31 controls sense amplifier 33, output data buffer 35, write buffer 37 and the like according to selecting/non-selecting of a chip and data read mode/data write mode. The group of bit line loads 21 set bit lines (not shown) of memory cell array 23 at a predetermined potential. That is, the group of bit line loads 21 precharge bit lines.

Figure 2:
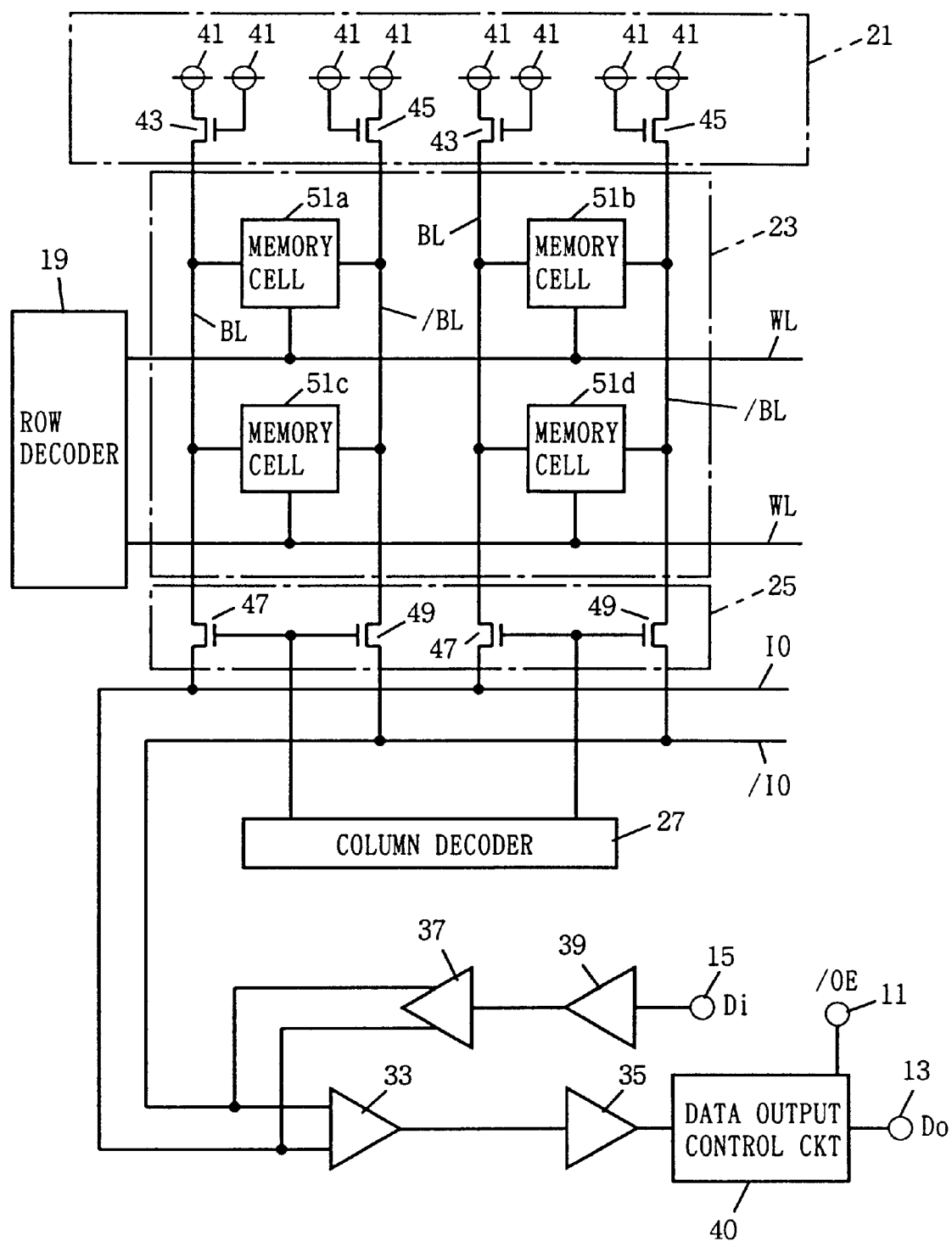
FIG. 2 is a schematic block diagram showing the memory cell array and the peripheral portion thereof shown in FIG. 1.

FIG. 2 is a schematic block diagram showing memory cell array 23 and the peripheral portion thereof in the SRAM shown in FIG. 1. Portions similar to those shown in FIG. 1 are designated by the identical reference numerals and the description thereof is, where appropriate, not repeated. Referring to FIG. 2, memory cell array 23 includes memory cells 51a–51d arranged at intersections of bit lines BL and /BL and word lines WL. While memory cells in the configuration of two rows and two columns in FIG. 2 are shown by way of example, three rows or more and three columns or more may configure the memory cell array.

The group of bit line loads 21 includes NMOS transistors 43 each provided between bit line BL of memory cell array 23 and a node receiving a power supply voltage Vcc from a power supply 41, and NMOS transistors 45 each provided between bit line /BL of memory cell array 23 and a node receiving power supply voltage Vcc from power supply 41. The gates of NMOS transistors 43 and 45 receive power supply voltage Vcc from power supply 41. Power supply 41 is an external power supply.

Multiplexer 25 includes NMOS transistors 47 each provided between bit line BL of memory cell array 23 and an input/output line IO, and NMOS transistors 49 each provided between bit line /BL of memory cell array 23 and an input/output line /IO. Column decoder 27 is connected to the gates of NMOS transistors 47 and 49. Row decoder 19 is connected to word line WL. Sense amplifier 33 is connected to a pair of input/output lines IO and /IO and senses and amplifies the difference in potential between the paired input/output lines IO and /IO.

An output node of sense amplifier 33 is connected to an input node of output data buffer 35. Output data buffer 35 amplifies an output of sense amplifier 33 to form output data Do. Output data Do is externally output from data output terminal 13 in response to output enable signal /OE. An input node of input data buffer 39 is connected to data input terminal 15, and an output node of input data buffer 39 is connected to an input node of write buffer 37. An output node of write buffer 37 is connected to the pair of input/output lines IO and /IO.

Figure 3:
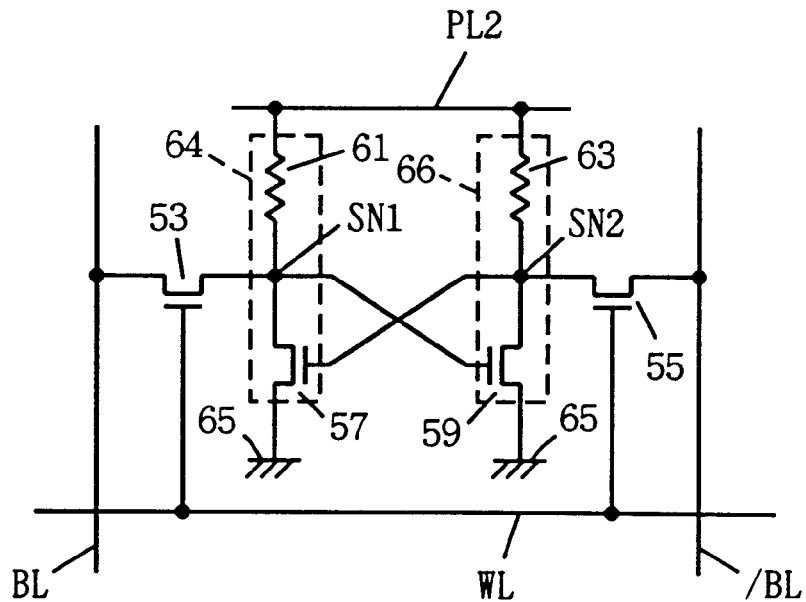
FIG. 3 is a circuit diagram showing the detail of the memory cell shown in FIG. 2.

FIG. 3 is a circuit diagram showing the detail of a high resistance load type memory cell as one example of memory cells 51a–51d shown in FIG. 2. Referring to FIG. 3, the high resistance load type memory cell includes high resistance elements 61 and 63, access transistors 53 and 55, and drive transistors 57 and 59. High resistance element 61 and NMOS transistor 57 constitute an inverter 64, and high resistance element 63 and NMOS transistor 59 constitute an inverter 66. High resistance element 61 is connected between a power supply voltage supply line PL2 and a storage node SN1. High resistance element 63 is connected between power supply voltage supply line PL2 and a storage node SN2. Driver transistor 57 is connected between storage node SN1 and a node receiving a ground voltage from a ground 65. The gate of driver transistor 57 is connected to storage node SN2. Driver transistor 59 is connected between storage node SN2 and a node receiving the ground voltage from ground 65. The gate of driver transistor 59 is connected to storage node SN1. Access transistor 53 is connected between a bit line BL and storage node SN1. The gate of access transistor 53 is connected to a word line WL. Access transistor 55 is connected between a bit line /BL and storage node SN2. The gate of access transistor 55 is connected to word line WL. Driver transistors 57 and 59 and access transistors 53 and 55 are NMOS transistors.

Figure 4:
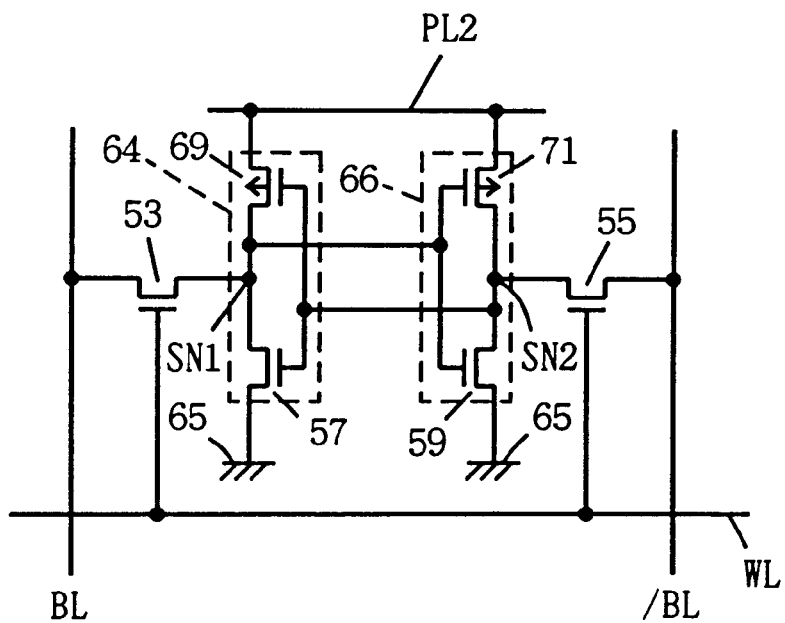
FIG. 4 is a circuit diagram showing the detail of another example of the memory cell shown in FIG. 2.

FIG. 4 is a circuit diagram showing the detail of a CMOS type memory cell as another example of memory cells 51a–51d shown in FIG. 2. Portions similar to those shown in FIG. 3 are designated by the identical reference numerals and a description thereof is, where appropriate, not repeated. Referring to FIG. 4, the CMOS type memory cell includes PMOS transistors 69 and 71, driver transistors 57 and 59, and access transistors 53 and 55. PMOS transistor 69 and NMOS transistor 57 constitute an inverter 64, and PMOS transistor 71 and NMOS transistor 59 constitute an inverter 66. PMOS transistor 69 is connected between a power supply voltage supply line PL2 and a storage node SN1. The gate of PMOS transistor 69 is connected to a storage node SN2. PMOS transistor 71 is connected between power supply voltage supply line PL2 and storage node SN2. The gate of PMOS transistor 71 is connected to storage node SN1.

Figure 5:
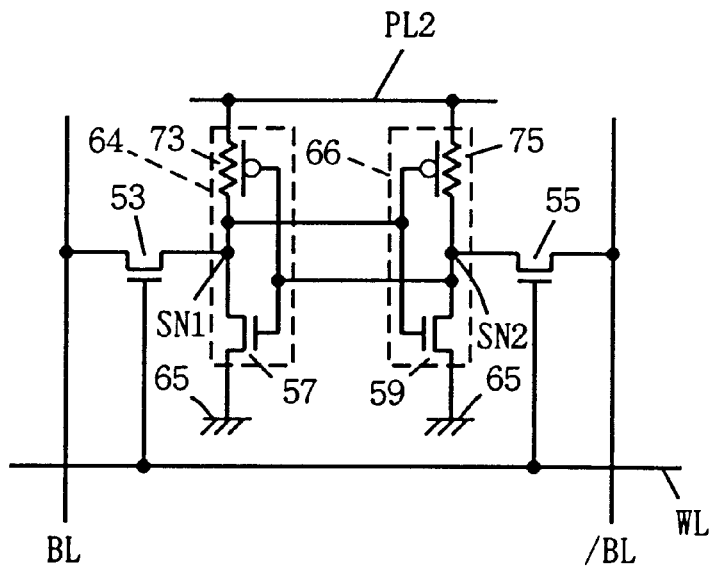
FIG. 5 is a circuit diagram showing the detail of still another example of the memory cell shown in FIG. 2.

FIG. 5 is a circuit diagram showing the detail of a TFT type memory cell as still another example of memory cells 51a–51d shown in FIG. 2. Portions similar to those shown in FIG. 4 are designated by the identical reference numerals and a description thereof is, where appropriate, not repeated. Referring to FIG. 5, the TFT type memory cell includes thin film transistors (referred to as TFTs hereinafter) 73 and 75, driver transistors 57 and 59, and access transistors 53 and 55. TFT 73 and NMOS transistor 57 constitute an inverter 64, an TFT 75 and NMOS transistor 59 constitute an inverter 66. TFT 73 is connected between a power supply voltage supply line PL2 and a storage node SN1. The gate of TFT73 is connected to a storage node SN2. TFT75 is connected between power supply voltage supply line PL2 and storage node SN2. The gate of TFT75 is connected to storage node SN1. TFTs 73 and 75 are p type transistors.

Figure 6:
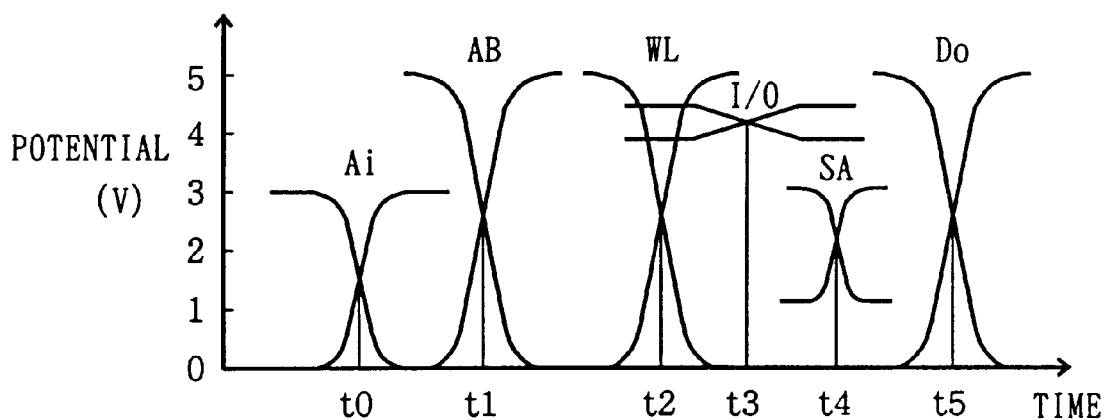
FIG. 6 is a waveform diagram illustrating timing of an operation of an SRAM according to the embodiment of the present invention.

FIG. 6 illustrates timing of an operation of an SRAM according to the embodiment of the present invention. Referring to FIGS. 1 and 2, FIG. 6 represents the address signals (a column address signal and a row address signal) Ai input around time point t0, outputs AB from address buffers (column address buffer 29 and row address buffer 17) around time point t1, a potential WL of word line WL around time point t2, potentials I/O of input/output lines IO and /IO around time point t3, an output SA from sense amplifier 33 around time point t4, and data Do externally output around time point t5. It should be noted that FIG. 6 illustrates a timing in the read operation. The horizontal axis represents time and the vertical axis represents potential.

Referring to FIGS. 1 and 2, to select memory cell 51a, for example, the group of row address input terminals 1 receive a row address signal corresponding to a row at which memory cell 51a to be selected is located. Then, row decoder 19 sets a word line WL connected to the memory cell 51a to be selected at a select level (high level, for example) and sets the other word lines WL at a non-select level (low level, for example). The row corresponding to the memory cell 51a to be selected is thus selected.

Selection of a column will now be described. The group of address input terminals 3 receive a column address signal corresponding to a column at which bit line pair BL and /BL connected to memory cell 51a to be selected is located. Then, column decoder 27 applies a high level signal to the gates of NMOS transistors 47 and 49 corresponding to the bit line pair BL and /BL connected to memory cell 51a to be selected. Thus, only NMOS transistors 47 and 49 corresponding to the bit line pair BL and /BL connected to memory cell 51 to be selected are turned on, and the bit line pair BL and /BL connected to memory cell 51a to be selected is connected to input/output line pair IO and /IO.

NMOS transistors 47 and 49 corresponding to the other bit line pairs BL and /BL receive a low level signal, and thus the NMOS transistors 47 and 49 corresponding to the other bit line pairs BL and /BL are turned off. This disconnects the other bit line pairs BL and /BL from input/output lines IO and /IO. A column is thus selected. Other memory cells 51b–51d are selected in the similar manner.

Referring to FIGS. 2 and 3, a read operation of the selected memory cell 51a will now be described. Assuming that the storage node SN1 of the selected memory cell 51a is at high level and the storage node SN2 is at low level, one driver transistor 57 of memory cell 51a is not conducting and the other driver transistor 59 is conducting. Since the word line WL connected to memory cell 51a has attained high level and has been selected, access transistors 53 and 55 of memory cell 51a are both conducting. Thus, direct current is generated by the route of power supply 41→NMOS transistor 45→bit line /BL→access transistor 55→driver transistor 59→ground 65. However, direct current does not pass through the other route, that is, power supply 41→NMOS transistor 43→bit line BL→access transistor 53→drive transistor 57→ground 65, since driver transistor 57 is not conducting.

The potential of the bit line BL which does not pass direct current is represented by power supply voltage Vcc minus Vth and the potential of the bit line /BL which passes direct current is represented by Vcc−Vth−ΔV wherein Vth represents the threshold voltage of NMOS transistors (bit line load transistors) 43 and 45, since the bit line /BL which passes direct current has its potential resistance-divided by the on-state resistances of driver transistor 59 and access transistor 55 and the on-state resistance of NMOS transistor 45 and the potential of the bit line /BL is thus reduced from power supply voltage Vcc minus Vth by ΔV. ΔV is referred to as bit line amplitude. Typically, bit line amplitude ΔV is approximately 50 mV–500 mV and is adjusted depending on the magnitude of the on-state resistance of NMOS transistors (bit line load transistors) 43 and 45. Bit line amplitude ΔV appears on paired input/output lines IO and /IO via NMOS transistors (transfer gates) 47 and 49. The bit line amplitude ΔV appearing on paired input/output lines IO and /IO is amplified by sense amplifier 33, further amplified by output data buffer 35 and read as output data Do. In reading, input data buffer 39 is controlled by read/write control circuit 31 (FIG. 1) so that it does not drive paired input/output lines IO and /IO.

The write operation will now be described. The potential to a bit line for writing LOW data is forced to be reduced to low potential and the potential of the other bit line is maintained at power supply voltage Vcc minus Vth to perform data write. As an example, the case in which inverted data is to be written into memory cell 51a when storage node SN1 of memory cell 51a attains high level and storage node SN2 attains low level, will be described. In this case, write buffer 37 sets one input/output line IO at low level and the other input/output line /IO is maintained at power supply voltage Vcc minus Vth, and one bit line BL is set at low level and the other bit line /BL is maintained at power supply voltage Vcc minus Vth to perform a write operation.

Characteristics of the present invention will now be described. The difference in potential between storage node SN1 and storage node SN2 of a memory cell when the SRAM is placed in a low-temperature environment (FIGS. 3–5) is smaller than the difference in potential between storage node SN1 and storage node SN2 at the normal temperature (high temperature). Thus, in order for an SRAM placed in the normal temperature (high temperature) to obtain the condition comparable to that of an SRAM placed in the low-temperature environment, the difference in potential between storage node SN1 and storage node SN2 at the normal temperature (high temperature) need be reduced. Thus, in carrying out testing at the normal temperature (high temperature) for stability of a memory cell, a condition comparable to that when the testing is performed in the low-temperature environment can be obtained by rendering the difference in potential between storage node SN1 and storage node SN2 of the memory cell smaller than that in the normal use. More specifically, the voltage applied to load elements (high resistance elements 61 and 63 shown in FIG. 3, PMOS transistors 69 and 71 shown in FIG. 4, and TFTs 73 and 75 shown in FIG. 5) of a memory cell in carrying out testing is rendered smaller than the voltage applied in the normal use to create a condition comparable to that of an SRAM in the low-temperature environment. The circuits for thus reducing the voltage applied to the load elements of an SRAM in carrying out testing (i.e., the circuits for changing the state of an SRAM in carrying out testing) are state change detect circuit 77 and power supply voltage select circuit 79 shown in FIG. 1.

Figure 7:
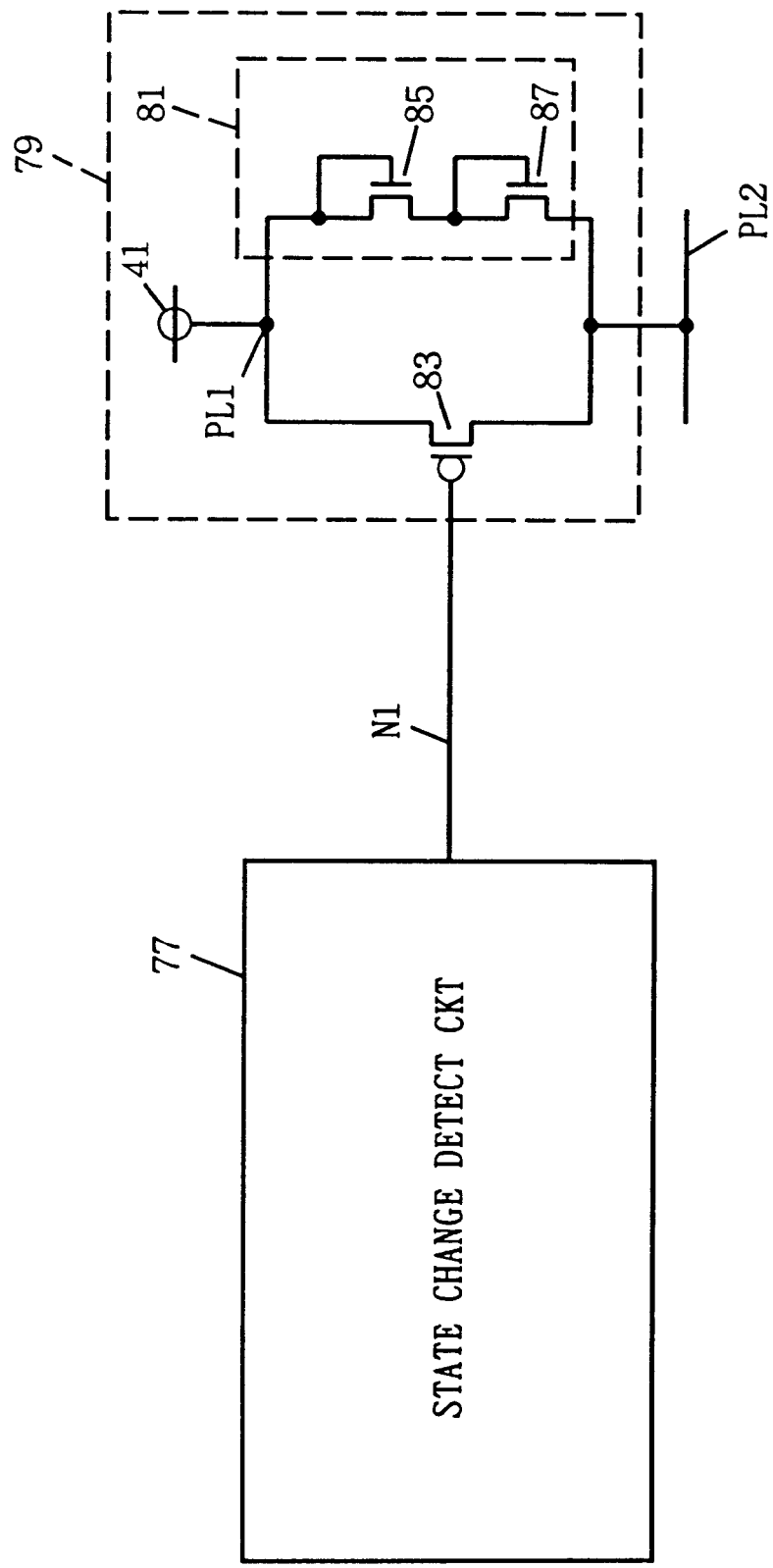
FIG. 7 is a circuit diagram showing the detail of the power supply voltage select circuit shown in FIG. 1.

FIG. 7 is a circuit diagram showing the detail of power supply voltage select circuit 79 shown in FIG. 1. Portions similar to those shown in FIGS. 1–5 are designated by the identical reference numerals and a description thereof is, where appropriate, not repeated. Referring to FIG. 7, power supply voltage select circuit 79 includes a PMOS transistor 83 and a voltage-down converter 81. Voltage-down converter 81 includes NMOS transistors 85 and 87. PMOS transistor 83 is provided between a power supply voltage supply line PL1 supplied with a power supply voltage Vcc from a power supply 41 and a power supply voltage supply line PL2, and has its gate connected to a node N1. NMOS transistors 85 and 87 are connected in series between power supply voltage supply lines PL1 and PL2. NMOS transistors 85 and 87 are diode-connected.

In the normal use, state change detect circuit 77 sets node N1 at low level. This causes PMOS transistor 83 to be turned on, and power supply voltage supply line PL2 receives power supply voltage Vcc from power supply 41. In carrying out testing, state change detect circuit 77 sets node N1 at high level. This causes PMOS transistor 83 to be turned off and power supply voltage supply line PL2 receives a voltage down-converted by voltage-down converter 81 from power supply voltage Vcc supplied by power supply 41. When seen from the memory cell, a power supply voltage applied to power supply voltage supply line PL2 in the normal use may be referred to as a first power supply voltage, and a voltage down-converted from power supply voltage Vcc supplied from power supply 41 and supplied to power supply voltage supply line PL2 may be referred to as a second power supply voltage.

Figures 8A, 8B:
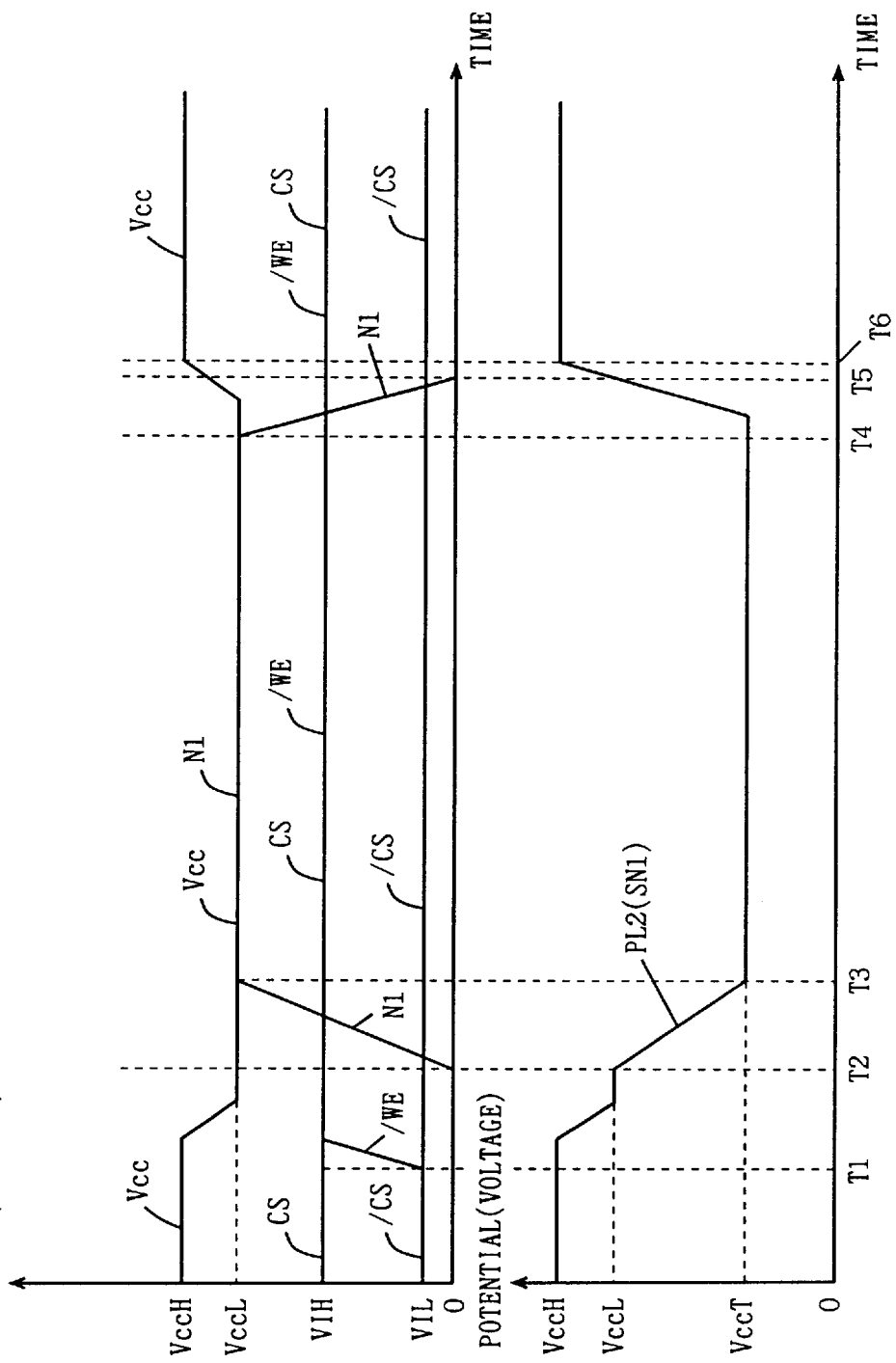
FIGS. 8A and 8B are timing charts illustrating operations of a state change detect circuit 77 and a power supply voltage select circuit 79 shown in FIG. 7.

FIGS. 8A and 8B show timing charts for illustrating in detail operations of state change detect circuit 77 and power supply voltage select circuit 79 shown in FIG. 7. Referring to FIGS. 1, 3, 7 and 8A and 8B, a write operation is completed by time point T1 and write enable signal /WE is changed to high level at time point T1. Write enable signal /WE and chip select signals CS and /CS attain high level when their levels are VIH or more, and attain low level when their levels are VIL or less. The case in which the potential of storage node SN1 is set at high level and the potential of storage node SN2 is set at low level, will now be considered.

At time point T1, power supply voltage Vcc attains VccH level. Between time point T1 and time point T2, power supply voltage Vcc is set at VccL level (<VccH). Responsively, the potential of power supply voltage supply line PL2 (storage node SN1) changes from VccH level to VccL level, At time point T3, at which testing is carried out, state change detect circuit 77 sets the potential of node N1 at high level. That is, the potential of node N1 attains VccL level. Thus, PMOS transistor 83 is not conductive. While PMOS transistor 83 is not conducting, a voltage down-converted by the two diode-connected NMOS transistors 85 and 87 from power supply voltage Vcc supplied from power supply 41 (i.e., VccT level) is supplied to power supply voltage supply line PL2 (storage node SN1). The level of the voltage supplied to power supply voltage supply line PL2 (storage node SN1) between time points T3 and T4 is represented by VccT=VccL−2Vth, wherein Vth (>0) represents the threshold voltage of NMOS transistors 85 and 87.

While state change detect circuit 77 maintains the potential of node N1 at high level (VccL level) (time points T3–T4), that is, while PMOS transistor 83 is not conducting, the potentials of word lines are successively set at high level to flow column current into all memory cells. That is, a read operation is performed so that all word lines are selected in the end. A read operation in which all word lines attain high level to flow column current into all memory cells must be performed between time points T3 and T4. It should be noted that power supply voltage Vcc applied to peripheral circuits (i.e., circuits other than the memory cell) between time points T3 and T4 is at VccL level. When a voltage applied to power supply voltage supply line PL2 is smaller than power supply voltage Vcc applied to the peripheral circuits, that is, between time points T3 and T4, various shipping tests related to stability of memory cells can be efficiently carried out.

By time point T6, power supply voltage Vcc attains VccH level. When the potential of node N1 attains low level (0V) at time point T5, PMOS transistor 83 is completely conducting. Thus, power supply voltage supply line PL2 (storage node SN1) receives a power supply voltage Vcc of VccH level. The peripheral circuits also receive a power supply voltage Vcc of VccH level from power supply 41. A read operation is performed for each of all memory cells after time point T6 and the read data are compared with the data written prior to time point T1 to determine whether the data match with each other. More specifically, pass/fail judgment is performed for all memory cells after time point T6 to detect any hold defect. It should be noted that pass/fail judgment need not be performed between time points T3 and T4, since read operations are performed in order to set all word lines at high level and flow column current into all memory cells. It also should be noted that the time period between time points T3 and T4 is a period in which testing is carried out. VccH level may match with VccL level between time points T1 and T6.

As described above, in an SRAM according to the embodiment of the present invention, a voltage smaller than that in the normal use is applied to power supply voltage supply line PL2 (a memory cell) in carrying out testing to render the difference in potential between storage nodes SN1 and SN2 smaller than the difference in potential between storage nodes SN1 and SN2 in the normal use so that a condition comparable to that of an SRAM placed in the low-temperature test environment is created. Thus, with an SRAM according to the embodiment of the present invention, a low-temperature test environment needs not be created and thus cost required for the testing can be reduced. Furthermore, a memory cell which would have data-hold defect at low temperature can be detected at the normal temperature or higher and thus an SRAM including such a defective memory cell can be removed.

It should be noted that chip select signal CS is always at high level and chip select signal /CS is always at low level. Write enable signal /WE is always at high level after time point T1. Chip select signals CS and /CS need not be taken into consideration for an SRAM which does not have chip select signals CS and /CS.

Figure 9:
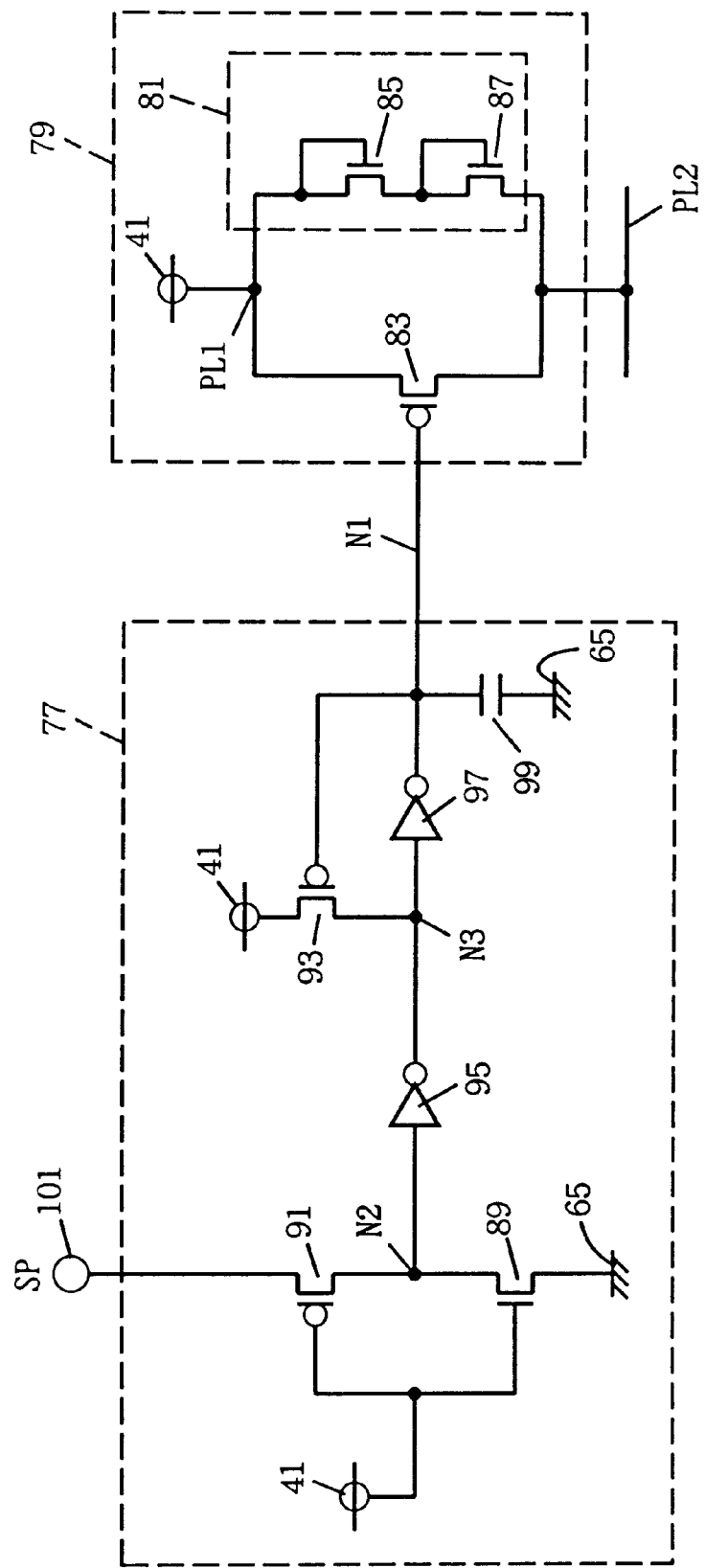
FIG. 9 is a circuit diagram showing the detail of the state change detect circuit shown in FIG. 7.

FIG. 9 is a circuit diagram showing the detail of state change detect circuit 77 shown in FIG. 7. Portions similar to those shown in FIGS. 1 and 7 are designated by the identical reference numerals, and a description thereof is, where appropriate, not repeated. Referring to FIG. 9, state change detect circuit 77 includes PMOS transistors 91 and 93, an NMOS transistor 89, inverters 95 and 97, and a capacitor 99. PMOS transistor 91 and NMOS transistor 89 are connected in series between a node connected to an SP input terminal 101 and a node receiving a ground voltage from ground 65. The gates of PMOS transistor 91 and NMOS transistor 89 receive power supply voltage Vcc from power supply 41. Inverter 95 is provided between nodes N2 and N3. Inverter 97 is provided between nodes N3 and N1. Capacitor 99 is provided between node N1 and a node receiving a ground voltage from ground 65. PMOS transistor 93 is provided between a node receiving power supply voltage Vcc from power supply 41 and node N3, and has its gate connected to node N1.

Figures 10A, 10B:
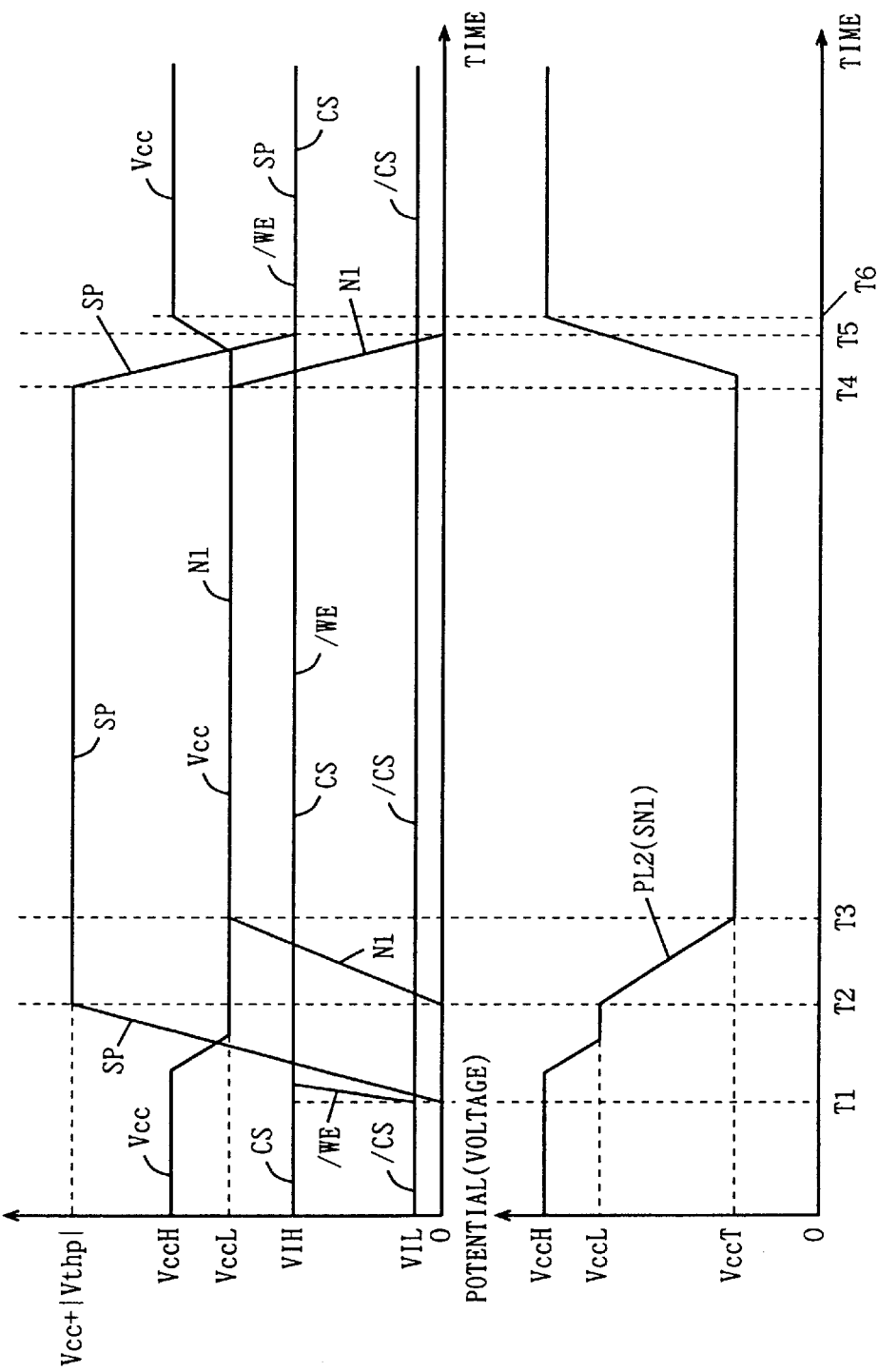
FIGS. 10A and 10B are timing charts for illustrating operations of the state change detect circuit 77 and the power supply voltage select circuit 79 shown in FIG. 9.

FIGS. 10A and 10B are timing charts for illustrating operations of state change detect circuit 77 and power supply voltage select circuit 79 shown in FIG. 9. The power supply voltage, signals and nodes identical to the power supply voltage, signals and nodes shown in FIGS. 8A and 8B are designated by identical reference numerals and a description thereof is, where appropriate, not repeated. Referring to FIGS. 9 and 10A and 10B, a signal SP input to an SP input terminal 101 at time point t2 is increased to the level of power supply voltage Vcc plus |Vthp| or more, wherein Vthp (<0) represents the threshold voltage of PMOS transistor 91. A voltage which is equal to, or more than the level of power supply voltage Vcc plus |Vthp| is herein referred to as super high level voltage.

When signal SP attains at least Vcc +|Vthp| level at time point t2, PMOS transistor 91 is conducting and the potential of node N2 attains high level. This causes the potential of node N1 to attain high level (VccL level). NMOS transistor 89 is also conducting, and the potential level of node N2 depends on the relation in magnitude of driving capability between PMOS transistor 91 and NMOS transistor 89. Thus, the size of PMOS transistor 91 is required to be considerably larger than the size of NMOS transistor 89. Since driving capability of a transistor varies depending on the manufacturing method, the sizes of transistors 91 and 89 are determined to ensure that the potential of node N2 attains high level in carrying out testing, more precisely, to ensure that the output of inverter 95 attains low level.

When inverter 95 outputs a low level signal, inverter 97 outputs a high level signal and PMOS transistor 83 is not conducting. PMOS transistor 93 and capacitor 99 are provided to ensure that PMOS transistor 83 is rendered conducting when testing is not carried out or when power supply is turned on. When signal SP is reduced at time point t4 below, the Vcc+|Vthp| level, node N1 responsively attains low level. This causes PMOS transistor 83 to be completely conducting at time point t5, and power supply voltage supply line PL2 receives a power supply voltage Vcc of VccH level. Thus, the period during which testing is carried out (time points T3–T4) is controlled depending on the period during which signal SP attains high level.

Figure 11:
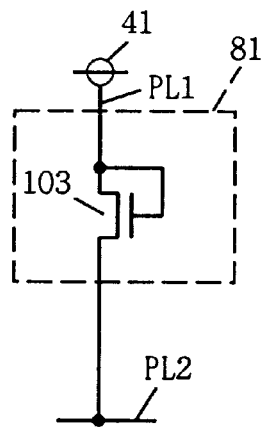
FIG. 11 is a circuit diagram showing the detail of another example of the voltage-down converter 81 shown in FIG. 7.

FIGS. 11–24 are circuit diagrams showing in detail other examples of voltage-down converter 81 shown in FIG. 7. Portions similar to those shown in FIG. 7 are designated by identical reference numerals and a description thereof is, where appropriate, not repeated. Referring to FIG. 11, voltage-down converter 81 is constituted by one NMOS transistor. The gate and drain of an NMOS transistor 103 is connected to power supply voltage supply line PL1 receiving power supply voltage Vcc from power supply 41, and the source is connected to power supply voltage supply line PL2. With such a voltage-down converter, the level of the voltage applied to power supply voltage supply line PL2 between time points T3 and T4 is VccT=VccL–Vth, wherein Vth is the threshold voltage of NMOS transistor 103.

Figure 12:
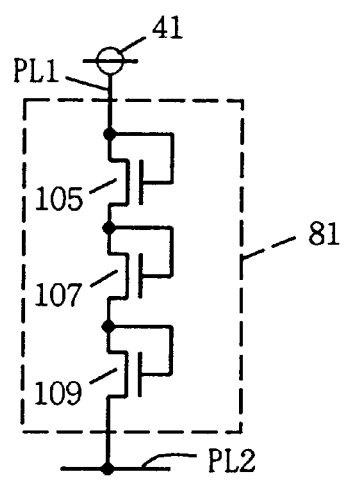
FIGS. 12–24 are circuit diagrams each showing the detail of still another example of the voltage-down converter 81 shown in FIG. 7.

Referring to FIG. 12, voltage-down converter 81 is formed of three NMOS transistors 105, 107 and 109. NMOS transistors 105, 107 and 109 are connected in series between power supply voltage supply line PL1 receiving a power supply voltage from power supply 41 and power supply voltage supply line PL2. NMOS transistors 105, 107 and 109 are each diode-connected. The level of the voltage applied to power supply voltage supply line PL2 between time points T3 and T4 is VccT=VccL–3Vth wherein Vth is the threshold voltage of each of NMOS transistors 105, 107 and 109.

As described above, any number of NMOS transistors forming voltage-down converter 81 may be used depending on the set value of a voltage applied to a memory cell (power supply voltage supply line PL2) in carrying out testing. The level of the voltage applied to the memory cell (power supply voltage supply line PL2) between time points T3 and T4 is VccL–t·Vth, wherein t (t≧1, t is a positive integer) represents the number of NMOS transistors forming voltage-down converter 81 and Vth(>0) represents the threshold voltage of an NMOS transistor forming voltage-down converter 81.

Figure 13:
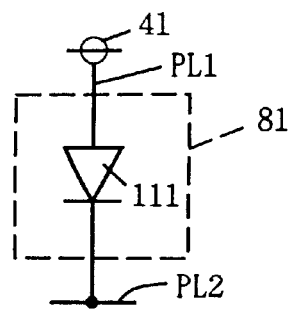

Referring to FIG. 13, voltage-down converter 81 is constituted by a pn junction diode 111. The p type layer of pn junction diode 111 is connected to power supply voltage supply line PL1 receiving power supply voltage Vcc from power supply 41, and the n type layer of pn junction diode 111 is connected to power supply voltage supply line PL2. That is, the anode of pn junction diode 111 is connected to power supply voltage supply line PL1 receiving a power supply voltage from power supply 41, and the cathode is connected to power supply voltage supply line PL2. The level of the voltage applied to power supply voltage supply line PL2 between time points T3 and T4 is VccL–Vf, wherein Vf represents the forward voltage of pn junction diode 111.

Figure 14:
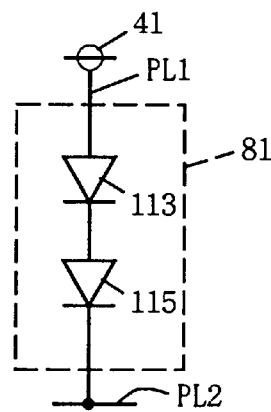

Referring to FIG. 14, voltage-down converter 81 is formed of two pn junction diodes 113 and 115. The anode of pn junction diode 113 is connected to power supply voltage supply line PL1 receiving power supply voltage Vcc from power supply 41, and the cathode is connected to the anode of pn junction diode 115. The cathode of pn junction diode 115 is connected to power supply voltage supply line PL2. The level of the voltage applied to power supply voltage supply line PL2 between time points T3 and T4 is VccL−2Vf, wherein Vf represents the forward voltage (>0) of each of pn junction diodes 113 and 115.

Figure 15:
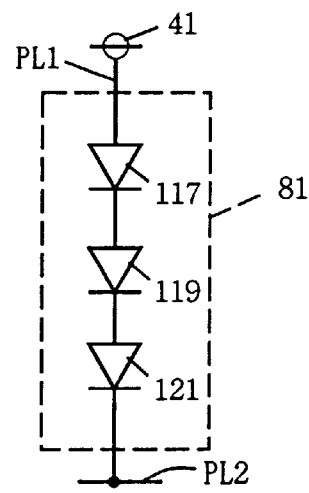

Referring to FIG. 15, voltage-down converter 81 is formed of three pn junction diodes 117, 119 and 121. The anode of pn junction diode 117 is connected to power supply voltage supply line PL1 receiving power supply voltage Vcc from power supply 41, and the cathode is connected to the anode of pn junction diode 119. The cathode of pn junction diode 119 is connected to the anode of pn junction diode 121. The cathode of pn junction diode 121 is connected to power supply voltage supply line PL2. The level of the voltage applied to power supply voltage supply line PL2 between time points T3 and T4 is VccL−3Vf, wherein Vf represents the forward voltage (>0) of each of pn junction diodes 117, 119 and 121.

As described above, any number of pn junction diodes forming voltage-down converter 81 may be used depending on the set value of a voltage applied to a memory cell (power supply voltage supply line PL2) in carrying out testing. The level of the voltage applied to the memory cell (power supply voltage supply line PL2) is represented by VccL−t·Vf, wherein t (t≧1, t is a positive integer) represents the number of the pn junction diodes and Vf (>0) represents the forward voltage of a pn junction diode.

Figure 16:
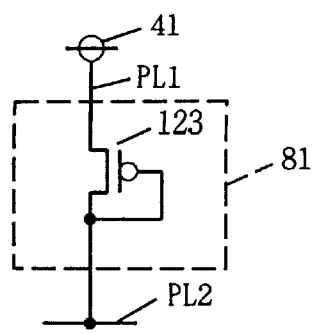

Referring to FIG. 16, voltage-down converter 81 is constituted by a PMOS transistor 123. The gate and drain of PMOS transistor 123 is connected to power supply voltage supply line PL2, and the source is connected to power supply voltage supply line PL1 receiving power supply voltage Vcc from power supply 41. The level of the voltage applied to power supply voltage supply line PL2 between time points T3 and T4 is VccL−|Vthp|, wherein Vthp represents the threshold voltage of PMOS transistor 123 and has a negative value.

Figure 17:
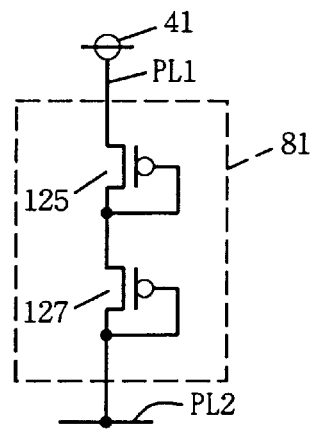

Referring to FIG. 17, voltage-down converter 81 is formed of two PMOS transistors 125 and 127. PMOS transistors 125 and 127 are connected in series between power supply voltage supply line PL1 receiving a power supply voltage from power supply 41 and power supply voltage supply line PL2. Furthermore, PMOS transistors 125 and 127 are each diode-connected. The level of the voltage applied to power supply voltage supply line PL2 between time points T3 and T4 is VccL−2|Vthp|, wherein Vthp represents the threshold voltage of each of PMOS transistors 125 and 127 and has a negative value.

Figure 18:
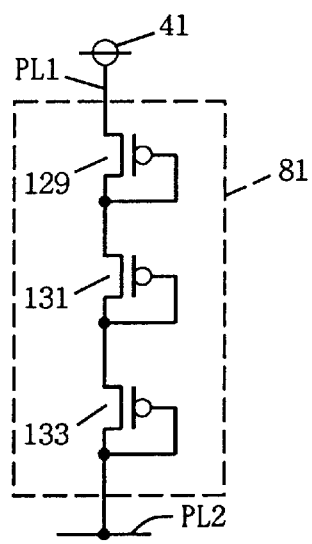

Referring to FIG. 18, voltage-down converter 81 is formed of three PMOS transistors 129, 131 and 133. PMOS transistors 129, 131, 133 are connected in series between power supply voltage supply line PL1 receiving power supply voltage Vcc from power supply 41 and power supply voltage supply line PL2. PMOS transistors 129, 131 and 133 are each diode-connected. The level of the voltage applied to power supply voltage supply line PL2 between time points T3 and T4 is VccL−3|Vthp|, wherein Vthp represents the threshold voltage of each of PMOS transistors 129, 131 and 133 and has a negative value.

As described above, any number of PMOS transistors forming voltage-down converter 81 may be used depending on the set value of a voltage applied to a memory cell (power supply voltage supply line PL2) in carrying out testing. The level of the voltage applied to the memory cell is VccL−t|Vthp|, wherein t (t>=1, t is a positive integer) represents the number of the PMOS transistors and Vthp (<0) represents the threshold voltage of a PMOS transistor.

Figure 19:
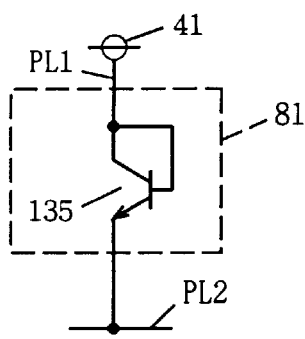

Referring to FIG. 19, voltage-down converter 81 is constituted by an npn type bipolar transistor 135. The collector and base of npn type bipolar transistor 135 is connected to power supply voltage supply line PL1 receiving power supply voltage vcc from power supply 41, and the emitter is connected to power supply voltage supply line PL2. The level of the voltage applied to power supply voltage supply line PL2 between the time points T3 and T4 is VccL−Vbe, wherein Vbe represents the voltage between the base and the emitter of npn type bipolar transistor 135 and has a positive value.

Figure 20:
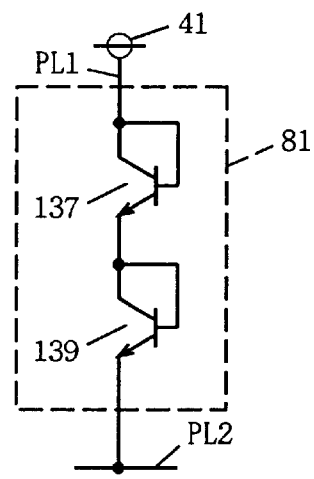

Referring to FIG. 20, voltage-down converter 81 is formed of two npn type bipolar transistors 137 and 139. Npn type bipolar transistors 137 and 139 are connected in series between power supply voltage supply line PL1 receiving power supply voltage Vcc from power supply 41 and power supply voltage supply line PL2. Npn type bipolar transistors 137 and 139 are each diode-connected. The level of the voltage applied to power supply voltage supply line PL2 between the time points T3 and T4 is VccL−2Vbe, wherein Vbe is the voltage between the base and the emitter of each of npn type bipolar transistors 137 and 139 and has a positive value.

Figure 21:
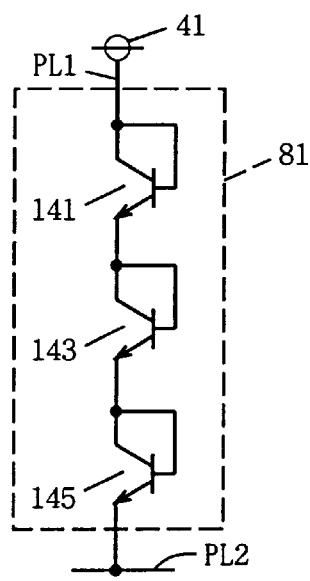

Referring to FIG. 21, voltage-down converter 81 is formed of three npn type bipolar transistors 141, 143, and 145. Npn type bipolar transistors 141, 143 and 145 are connected in series between power supply voltage supply line PL1 receiving power supply voltage Vcc from power supply 41 and power supply voltage supply line PL2. Npn type bipolar transistors 141, 143 and 145 are each diode-connected. The level of the voltage applied to power supply voltage supply line PL2 between time points T3 and T4 is VccL−3Vbe, wherein Vbe is the voltage between the base and the emitter of each of npn type bipolar transistors 141, 143 and 145 and has a positive value.

As described above, any number of npn type bipolar transistors forming voltage-down converter 81 may be used depending on the set value of a voltage applied to a memory cell (power supply voltage supply line PL2) in carrying out testing. The level of the voltage applied to the memory cell is VccL−tVbe, wherein t (t≧1, t is a positive integer) represents the number of npn type bipolar transistors and Vbe (>0) represents the voltage between the base and the emitter of an npn type bipolar transistor.

Figure 22:
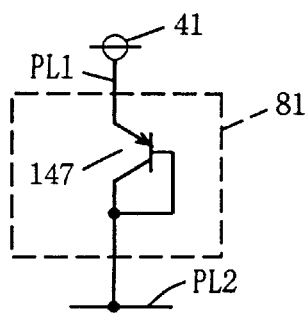

Referring to FIG. 22, voltage-down converter 81 is constituted by a pnp type bipolar transistor 147. The collector and base of pnp type bipolar transistor 147 is connected to power supply voltage supply line PL2 and the emitter is connected to power supply voltage supply line PL1 receiving power supply voltage Vcc from power supply 41. The level of the voltage applied to power supply voltage supply line PL2 between the time points T3 and T4 is VccL−Vbe, wherein Vbe represents the voltage between the base and the emitter of the pnp type bipolar transistor and has a positive value.

Figure 23:
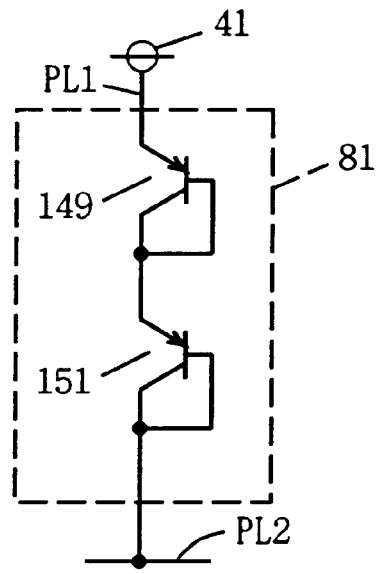

Referring to FIG. 23, voltage-down converter 81 is formed of two pnp bipolar transistors 149 and 151 connected in series between power supply voltage supply line PL1 receiving power supply voltage Vcc from power supply 41 and power supply voltage supply line PL2. Pnp type bipolar transistors 149 and 151 are each diode-connected. The level of the voltage applied to power supply voltage supply line PL2 between time points T3 and T4 is VccL−2Vbe, wherein Vbe represents the voltage between the base and emitter of each of pnp type bipolar transistors 149 and 151 and has a positive value.

Figure 24:
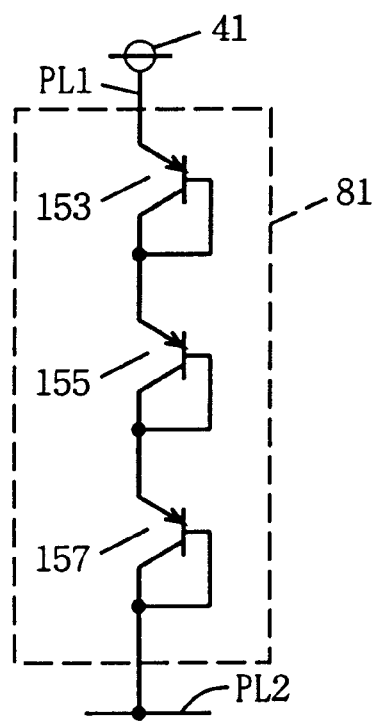

Referring to FIG. 24, voltage-down converter 81 is formed of three pnp bipolar transistors 153, 155 and 157. Pnp bipolar transistors 153, 155 and 157 are connected in series between power supply voltage supply line PL1 receiving power supply voltage Vcc from power supply 41 and power supply voltage supply line PL2. Pnp type bipolar transistors 153, 155 and 157 are each diode-connected. The level of the voltage applied to power supply voltage supply line PL2 between time points T3 and T4 is VccL−3Vbe, wherein Vbe represents the voltage between the base and emitter of each of pnp bipolar transistors 153, 155 and 157 and has a positive value.

As described above, any number of pnp bipolar transistors forming voltage-down converter 81 may be used depending on the set value of a voltage applied to a memory cell in carrying out testing. The level of the voltage applied to the memory cell in carrying out testing is VccL−tVbe, wherein t (t≧1, t is a positive integer) represents the number of the pnp type bipolar transistors and Vbe (>0) represents the voltage between the base and emitter of a pnp type bipolar transistor.

Figure 25:
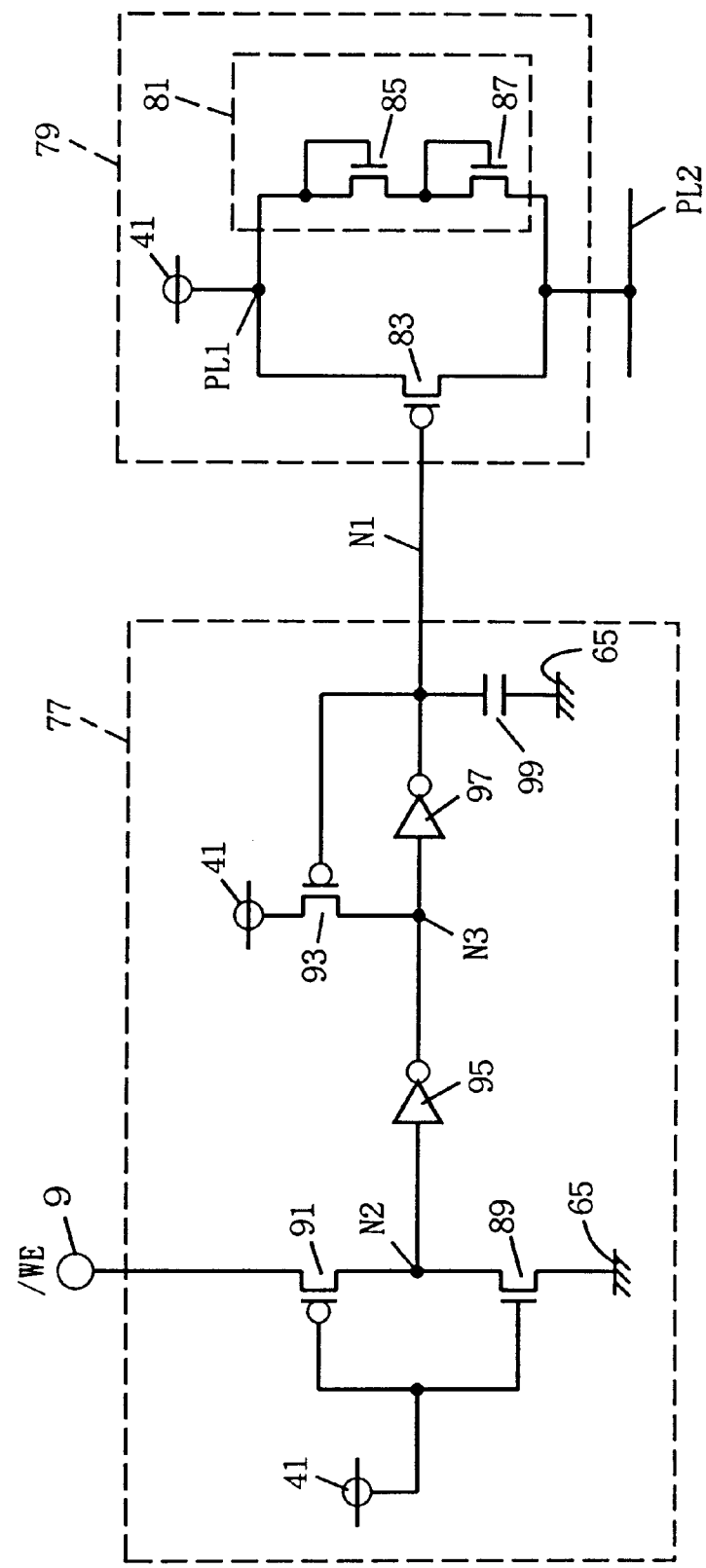
FIG. 25 is a circuit diagram showing the detail of another example of the state change detect circuit 77 shown in FIG. 7.

FIG. 25 is a circuit diagram showing the detail of another example of state change detect circuit 77 shown in FIG. 7. Portions similar to those shown in FIGS. 9 are designated by identical reference numerals and a description thereof is, where appropriate, not repeated. Referring to FIG. 25, a PMOS transistor 91 included in state change detect circuit 77 is provided between a node connecting with a /WE input terminal 9 and a node N2. SP input terminal 101 shown in FIG. 1 is not required for this state change detect circuit 77.

Figures 26A, 26B:
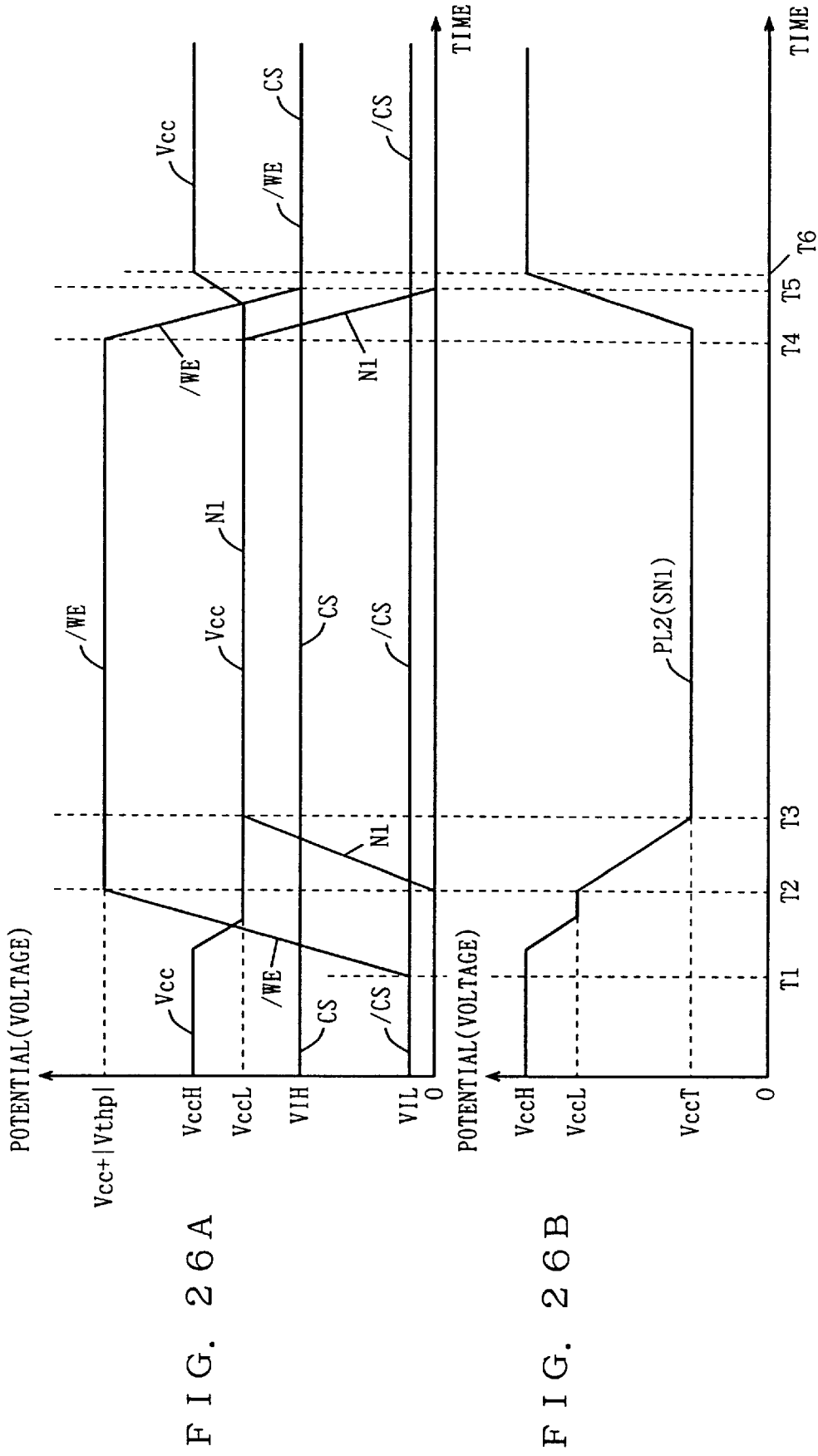
FIGS. 26A and 26B are timing charts for illustrating operations of the state change detect circuit 77 and power supply voltage select circuit 79 shown in FIG. 25.

FIGS. 26A and 26B are timing charts for illustrating operations of state change detect circuit 77 and power supply voltage select circuit 79 shown in FIG. 25. The power supply voltage, signals and nodes identical to those shown in FIGS. 8A and 8B are designated by the same reference numerals as indicated in FIGS. 8A and 8B and a description thereof is, where appropriate, not repeated. Referring to FIGS. 26A and 26B, a write operation is completed by time point T1, and write enable signal /WE attains high level thereafter and further rises to the Vcc+|Vthp| level at time point T2. When write enable signal /WE attains at least the Vcc+|Vthp| level, PMOS transistor 91 is rendered conducting and node N2 attains high level. This causes the potential of node N3 to attain low level, and the potential of node N1 to attain high level. This causes PMOS transistor 83 to be completely turned off at time point T3.

When the level of write enable signal /WE is rendered smaller than the Vcc−|Vthp| level, the potential of node N1 responsively attains low level. This causes PMOS transistor 83 to be completely conducting after time point T5. Thus, the period during which testing is carried out (time points T3–T4) is controlled depending on the period during which write enable signal /WE attains the Vcc−|Vthp| level. After time point T5, write enable signal /WE is set at VIH level. For an SRAM which does not have chip select signals CS and /CS, these signals need not be taken into consideration.

Figure 27:
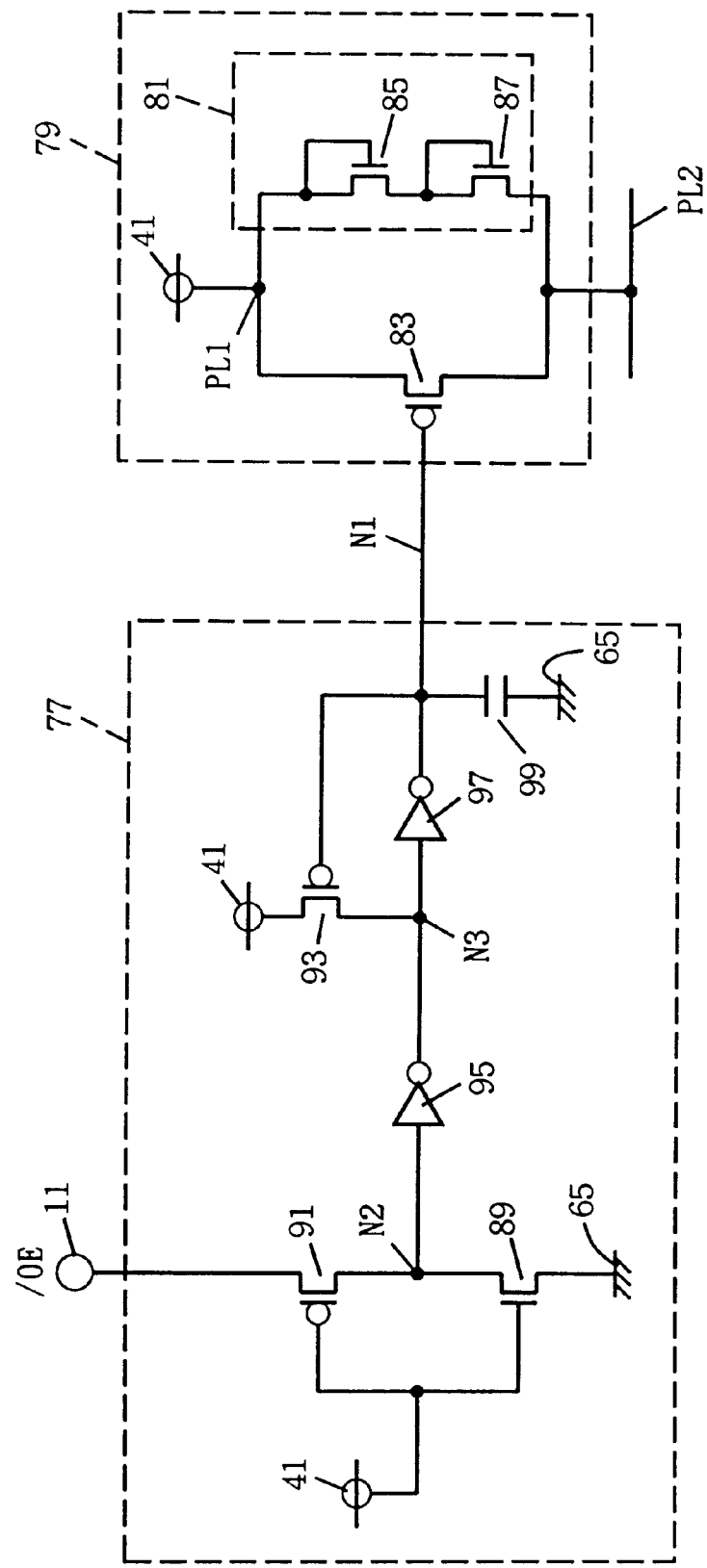
FIG. 27 is a circuit diagram showing the detail of still another example of the state change detect circuit 77 shown in FIG. 7.

FIG. 27 is a circuit diagram showing the detail of still another example of state change detect circuit 77 shown in FIG. 7. The portions similar to those shown in FIG. 9 are designated by identical reference numerals and a description thereof is, where appropriate, not repeated. Referring to FIG. 27, a PMOS transistor 91 included in state change detect circuit 77 is provided between a node connecting with a /OE input terminal 11 and a node N2. SP input terminal 101 shown in FIG. 1 is not required for this state change detect circuit 77.

Figures 28A, 28B:
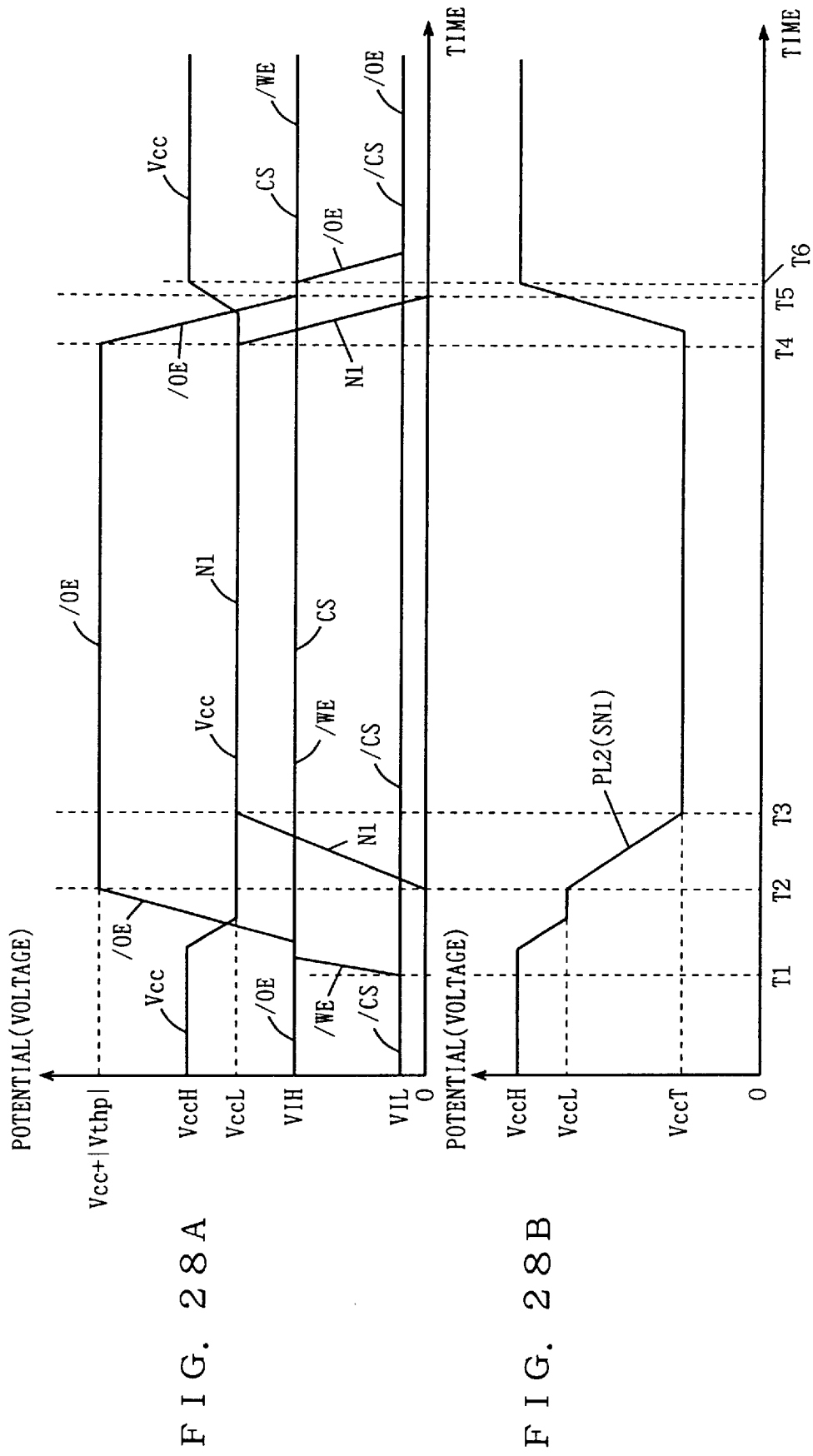
FIGS. 28A and 28B are timing charts for illustrating operations of the state change detect circuit 77 and power supply voltage select circuit 79 shown in FIG. 27.

FIGS. 28A and 28B are a timing chart for illustrating operations of state change detect circuit 77 and power supply voltage select circuit 79 shown in FIG. 27. The power supply voltage, signals and nodes identical to those shown in FIGS. 8A and 8B are designated by identical reference numerals indicated in FIGS. 8A and 8B, and a description thereof is, where appropriate, not repeated. Referring to FIGS. 28A and 28B, the level of output enable signal /OE is increased to at least the Vcc+|Vthp| level at time point T2. This causes PMOS transistor 91 to be turned on and the potential of node N2 attains high level. This causes the potential of node N3 to attain low level, and the potential of node N1 to attain high level. This causes PMOS transistor 83 to be completely turned off after time point T3. When the level of output enable signal /OE is rendered smaller than the Vcc+|Vthp| level at time point T4, the potential of node N1 responsively attains low level. This causes PMOS transistor 83 to be completely conducting at time point T5. Thus, the period during which testing is carried out (time points T3–T4) is controlled depending on the period during which output enable signal /OE attains the Vcc+|Vthp| level. Output enable signal /OE is set at low level (VIL level) after time point T4. For an SRAM which does not have chip select signals CS and /CS, these signals need not be taken into consideration.

Figure 29:
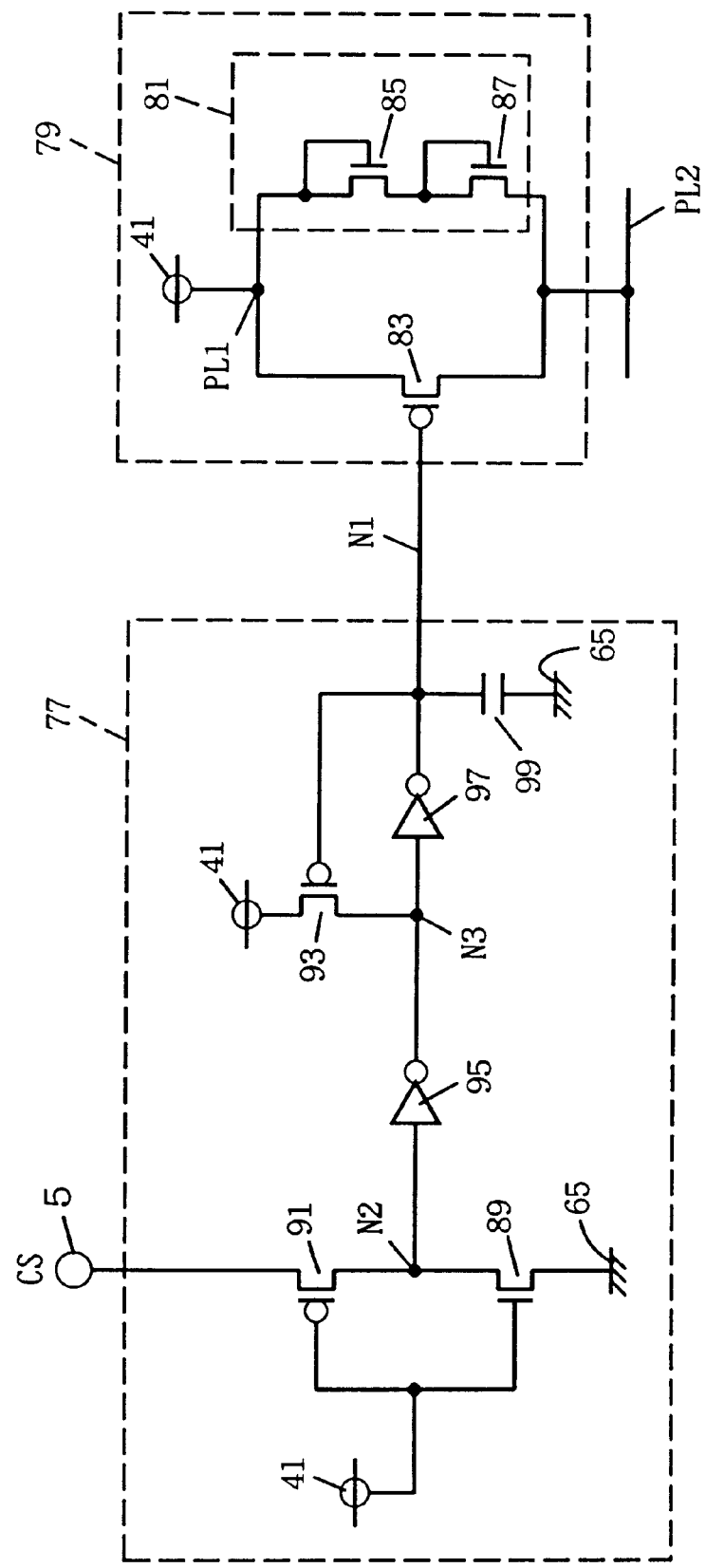
FIG. 29 is a circuit diagram showing the detail of still another example of the state change detect circuit 77 shown in FIG. 7.

FIG. 29 is a circuit diagram showing the detail of still another example of state change detect circuit 77 shown in FIG. 7. Portions similar to those shown in FIG. 9 are designated by identical reference numerals and a description thereof is, where appropriate, not repeated. Referring to FIG. 29, state change detect circuit 77 has PMOS transistor 91 connected between a node connecting with a CS input terminal 5 and node N2.

Figures 30A, 30B:
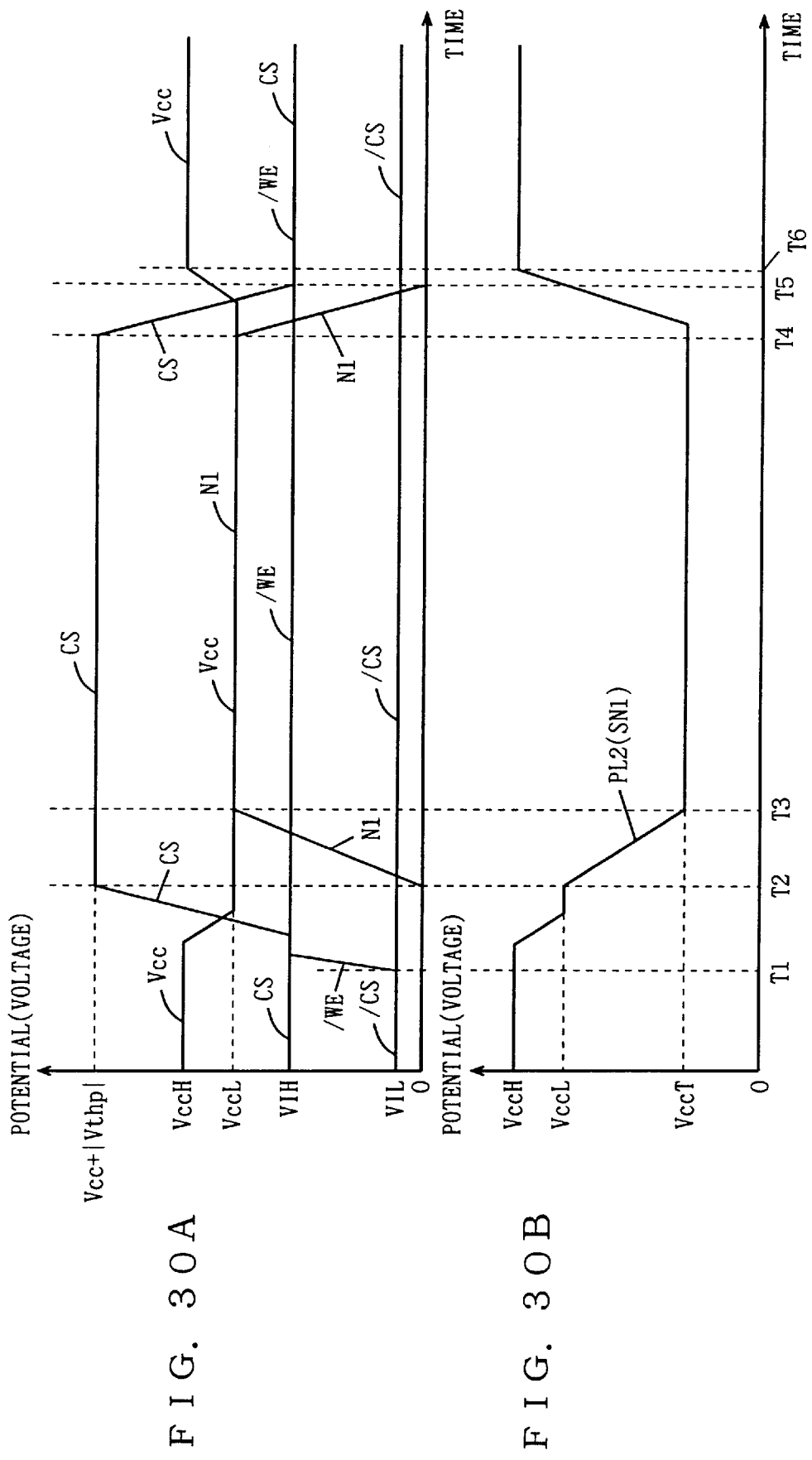
FIGS. 30A and 30B are timing charts for illustrating operations of the state change detect circuit 77 and power supply voltage select circuit 79 shown in FIG. 29.
Figure 31:
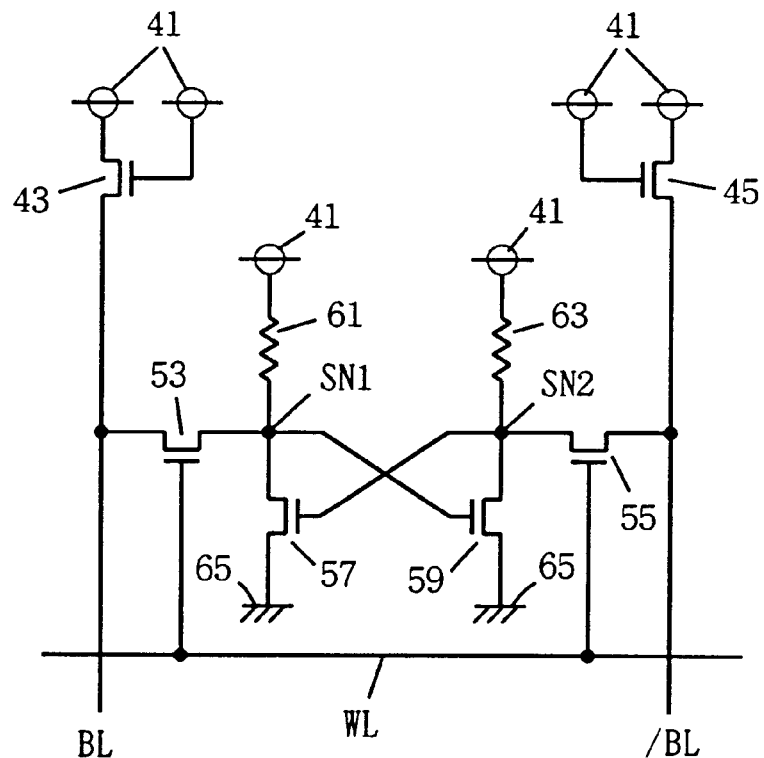
FIG. 31 is a circuit diagram showing the detail of a conventional SRAM memory cell.
Figure 32:
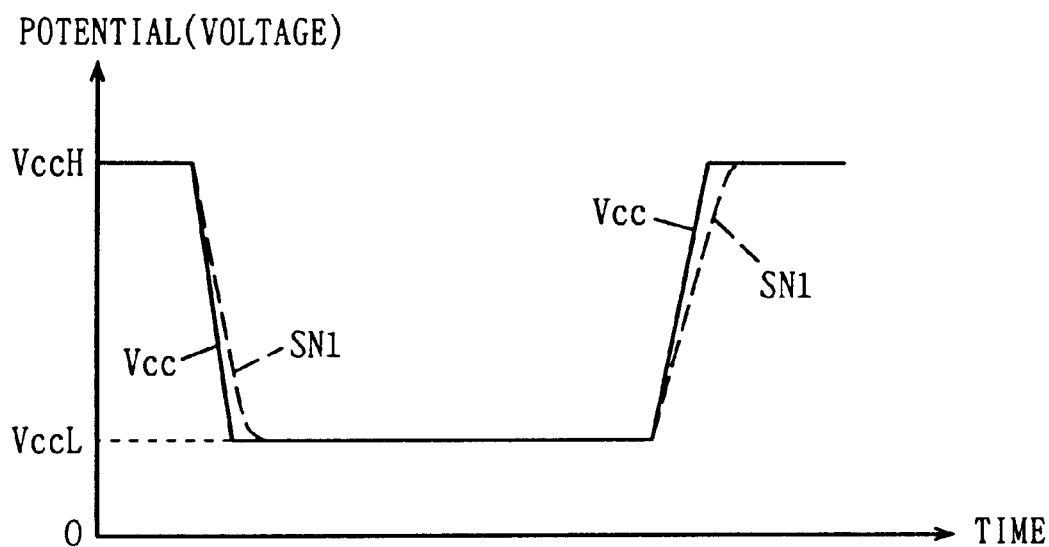
FIG. 32 illustrates change of the potential of a storage node (SN1) of a conventional SRAM at the normal temperature.

FIGS. 30A and 30B are timing charts for illustrating operations of state change detect circuit 77 and power supply voltage select circuit 79 shown in FIG. 29. The power supply voltage, signals and nodes identical to those shown in FIGS. 8A and 8B are designated by identical reference numerals and a description thereof, where appropriate, not repeated. Referring to FIGS. 30A and 30B, the level of chip select signal CS is increased to at least the Vcc+|Vthp| level at time point T2. This causes PMOS transistor 91 to be conducting and node N2 attains high level. This causes node N3 to attain low level, and node N1 to attain high level. This causes PMOS transistor 83 to be turned off. When the level of chip select signal CS is rendered smaller than the Vcc+|Vthp| level at time point T4, the potential of node N1 responsively attains low level. This causes PMOS transistor 83 to be completely turned on at time point T5. Thus, the period during which testing is carried out (time points T3–T4) is controlled depending on the period during which chip select signal CS attains the Vcc+|Vthp| level. After time point T5, chip select signal CS is set at VIH level.

Thus, in an SRAM according to the embodiment of the present invention, a voltage applied to load elements (high resistance elements 61 and 63 shown in FIG. 3, PMOS transistors 69 and 71 shown in FIG. 4, and TFTs 73 and 75 shown in FIG. 5) for a memory cell in carrying out testing is rendered smaller than the voltage applied thereto in the normal use. This allows a condition comparable to that of an SRAM placed in the low-temperature environment to be created at the normal temperature or higher and thus the cost for creating a test environment can be reduced. Furthermore, low-temperature hold defect can be detected at the normal temperature or higher and thus an SRAM including a memory cell having such a defect can be removed. In summary, with an SRAM according to the present embodiment of the present invention, cost for testing can be reduced and testing capability can be improved.

In an SRAM according to the present embodiment of the present invention, the value of a voltage applied to a load elements for a memory cell can be changed to efficiently carry out various shipping tests related to stability of the memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:

a plurality of memory cells each having first and second storage nodes to be set at potentials of different levels from each other;

state change detect means for detecting change of state of said memory device from the normal use mode to a testing mode;

power supply voltage select means for applying a first power supply voltage to said plurality of memory cells when said state change detect means does not detect any change in the state from the normal use mode, and for applying a second power supply voltage to said plurality of memory cells when said state change detect means detects any change in the state from the normal use mode, said second power supply voltage is different in level from said first power supply voltage; wherein said first and second power supply voltages are for setting potential of said first or second storage node of said memory cell at a level according to the stored information; and means for testing said plurality of memory cells during application of said second power supply voltage thereto.

2. The static semiconductor memory device according to claim 1, further comprising a plurality of pairs of bit lines, wherein said memory cell includes;

a first inverter having an input node connected to said first storage node and having an output node connected to said second storage node;

a second inverter having an input node connected to said second storage node and having an output node connected to said first storage node;

a first transfer gate provided between said first storage node and one bit line of said bit line pair; and a second transfer gate provided between said second storage node and the other bit line of said bit line pair.

3. The static semiconductor memory device according to claim 1, further comprising a first line receiving said first power supply voltage, and a second line for applying one of said first and second power supply voltages to said plurality of memory cells, wherein:

said power supply voltage select means includes connecting/disconnecting means for connecting or disconnecting said first line with said second line, and voltage down-converting means provided between said first line and said second line for applying to said second line said second power supply voltage down-converted from said first power supply voltage; and said connecting/disconnecting means connects said first line with said second line when said state change detect means does not detect any change in the state, and said connecting/disconnecting means disconnects said first line from said second line when said state change detect means detects any change in the state.

4. The static semiconductor memory device according to claim 3, wherein said voltage down-converting means includes a pn junction diode.

5. The static semiconductor memory device according to claim 3, wherein said voltage down-converting means includes a diode-connected transistor.

6. The static semiconductor memory device according to claim 3, wherein said voltage down-converting means includes a plurality of pn junction diodes.

7. The static semiconductor memory device according to claim 3, wherein said voltage down-converting means includes a plurality of transistors each diode-connected.

8. The static semiconductor memory device according to claim 1, further comprising a terminal used for instructing a change in the state, said terminal receiving a super high level voltage when a state is to be changed, said super high level voltage is higher in level than said first and second power supply voltages, wherein said state change detect means detects a change in the state when said terminal receives said super high level voltage.

9. The static semiconductor memory device according to claim 8, wherein:

said terminal receives a read/write control signal for enabling writing of information into said memory cell when a level of said control signal does not exceed a first predetermined level and for disabling writing of information into said memory cell when a level of said control signal is not less than a second predetermined level; and a level of said super high level voltage is higher than that of said second predetermined level.

10. The static semiconductor memory device according to claim 8, wherein:

said terminal receives an output control signal for enabling external outputting of information read from said memory cell when a level of said control signal does not exceed a first predetermined level and for disabling external outputting of information read from said memory cell when a level of said control signal is not less than a second predetermined level; and a level of said super high level voltage is higher than that of said second predetermined level.

11. The static semiconductor memory device according to claim 8, wherein:

said terminal receives a chip select signal for putting said static semiconductor memory device into a selected state when a level of said select signal is not less than a predetermined level; and said super high level voltage is higher than said predetermined level.

12. A method of testing a static semiconductor memory device including a plurality of memory cells each having first and second storage nodes to be set at potentials of different levels from each other, comprising the steps of:

rendering a difference in potential between said first storage nodes and said second storage nodes in a testing mode that is smaller than a difference in potential between said first storage nodes and said second storage nodes in normal use for a memory cell that is to be tested; and, during said rendering step:

flowing current into one of said first storage node and said second storage node in the memory cell to be tested; and reading data from the memory cell to which said current is flowed.

* * * * *